US012362220B2

(12) United States Patent
Kim et al.

(10) Patent No.: US 12,362,220 B2
(45) Date of Patent: Jul. 15, 2025

(54) METHOD FOR MANUFACTURING DISPLAY DEVICE, AND TRANSFER SUBSTRATE FOR MANUFACTURING DISPLAY DEVICE

(71) Applicant: LG ELECTRONICS INC., Seoul (KR)

(72) Inventors: Jungsub Kim, Seoul (KR); Yongdae Kim, Seoul (KR); Sunghyun Moon, Seoul (KR)

(73) Assignee: LG ELECTRONICS INC., Seoul (KR)

( * ) Notice: Subject to any disclaimer, the term of this patent is extended or adjusted under 35 U.S.C. 154(b) by 511 days.

(21) Appl. No.: 17/630,288

(22) PCT Filed: Aug. 7, 2019

(86) PCT No.: PCT/KR2019/009861
§ 371 (c)(1),
(2) Date: Jan. 26, 2022

(87) PCT Pub. No.: WO2021/025201
PCT Pub. Date: Feb. 11, 2021

(65) Prior Publication Data
US 2022/0277983 A1    Sep. 1, 2022

(30) Foreign Application Priority Data

Aug. 6, 2019    (KR) .................. 10-2019-0095605

(51) Int. Cl.
*H01L 21/683* (2006.01)
*G03F 7/00* (2006.01)
(52) U.S. Cl.
CPC ........ *H01L 21/6835* (2013.01); *G03F 7/0002* (2013.01); *H01L 2221/68354* (2013.01)
(58) Field of Classification Search
None
See application file for complete search history.

(56) References Cited

U.S. PATENT DOCUMENTS 9,377,682 B2 *   6/2016   Kanamitsu ............. B82Y 40/00
2007/0072351 A1 * 3/2007   Ishibashi ............... G03F 9/7065
                                                          438/150

(Continued)

FOREIGN PATENT DOCUMENTS

JP    2012119572    6/2012
JP    2013086294    5/2013

(Continued)

OTHER PUBLICATIONS

Kubo S. "English Machine Translation of JP-2013086294-A." 2024. Espacenet. EPO. (Year: 2024).*

(Continued)

*Primary Examiner* — Larry W Thrower
*Assistant Examiner* — Jonathan B Woo
(74) *Attorney, Agent, or Firm* — LEE, HONG, DEGERMAN, KANG & WAIMEY

(57) ABSTRACT

Disclosed, in the present specification, is a transfer substrate for transferring a semiconductor light emitting device with high reliability and a method for manufacturing a display device by using same. Specifically, the transfer substrate includes an organic stamp layer having a protrusion, wherein the organic stamp layer contains a plurality of inorganic fillers, and the concentration of the inorganic fillers is formed so as to increase as the distance from the protrusion increases. Therefore, the protrusion of the organic stamp layer has a low concentration of the inorganic fillers so as to maintain sufficient adhesion for transferring the semiconductor light emitting device, and the stiffness of the organic stamp layer itself is formed so as to be much stronger than that of a stamp layer using a single organic material. Accordingly, it is possible to improve the accuracy of transfer by minimizing an arrangement error of the semiconductor light emitting device due to the deformation of the (Continued)

stamp layer occurring in a transfer process. Accordingly, it is possible to improve the accuracy of transfer by minimizing an arrangement error of the semiconductor light emitting device caused by the deformation of the stamp layer occurring during a transfer process.

18 Claims, 23 Drawing Sheets

(56) References Cited

U.S. PATENT DOCUMENTS

| | | | | |
|---|---|---|---|---|
| 2012/0048184 | A1* | 3/2012 | Lee | C08G 79/00 |
| | | | | 264/496 |
| 2014/0151733 | A1* | 6/2014 | Koike | B82Y 40/00 |
| | | | | 216/13 |
| 2015/0044417 | A1* | 2/2015 | Koike | B32B 27/325 |
| | | | | 264/447 |
| 2015/0140837 | A1* | 5/2015 | Chemin | B29C 59/026 |
| | | | | 438/781 |
| 2015/0158268 | A1* | 6/2015 | Koike | B32B 3/30 |
| | | | | 156/247 |
| 2017/0115581 | A1* | 4/2017 | Kanamitsu | G03F 9/7042 |
| 2019/0070775 | A1* | 3/2019 | Jeong | G03F 7/0002 |
| 2020/0249567 | A1* | 8/2020 | Fukuhara | G03F 7/0002 |

FOREIGN PATENT DOCUMENTS

| | | | |
|---|---|---|---|
| JP | 2013086294 A | * | 5/2013 |
| KR | 10-2006-0104735 | | 10/2006 |
| KR | 100843392 | | 7/2008 |
| KR | 1020110118616 | | 10/2011 |
| KR | 1020170063528 | | 6/2017 |
| WO | 2012021739 | | 2/2012 |
| WO | 2019013120 | | 1/2019 |

OTHER PUBLICATIONS

KIPO. "English Translated Request for the Submission of an Opinion." Dec. 11, 2024. Espacenet. (Year: 2024).*
PCT International Application No. PCT/KR2019/009861 Written Opinion of the International Searching Authority dated May 6, 2020, 21 pages.
Korean Intellectual Property Office Application No. 10-2019-0095605, Office Action dated Dec. 11, 2024, 7 pages.

* cited by examiner

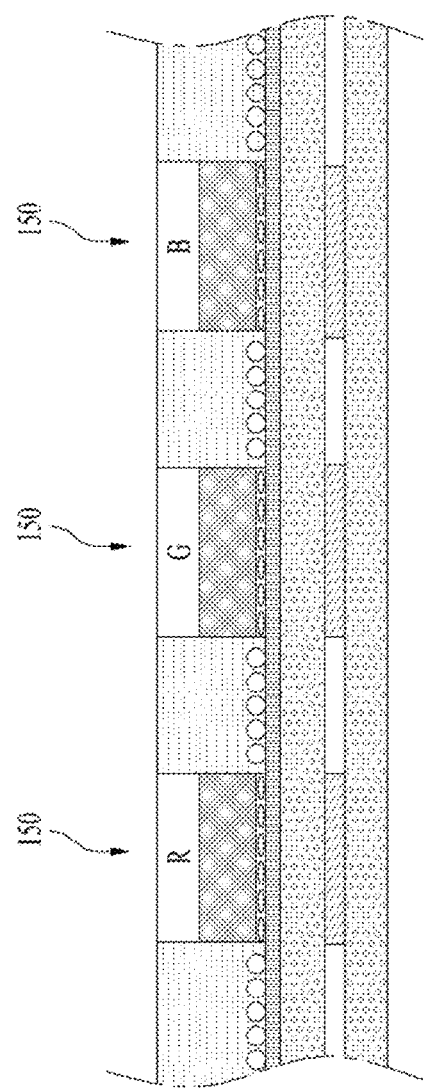

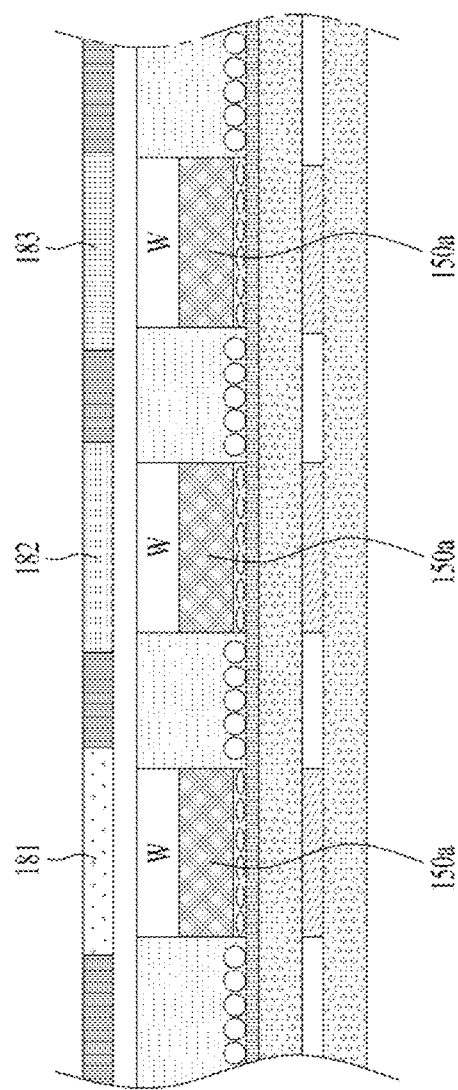

FIG. 20

| Silica wt% | 0 | 5 | 10 | 15 | 20 |
|---|---|---|---|---|---|
| z-axis disp. [um] | 10.0 | 8.9 | 6.6 | 6.5 | 5.9 |
| Position shift [um] | 6.8 | 5.9 | 3.9 | 3.9 | 3.4 |

METHOD FOR MANUFACTURING DISPLAY DEVICE, AND TRANSFER SUBSTRATE FOR MANUFACTURING DISPLAY DEVICE

CROSS-REFERENCE TO RELATED APPLICATIONS

This application is the National Stage filing under 35 U.S.C. 371 of International Application No. PCT/KR2019/009861, filed on Aug. 7, 2019, which claims the benefit of earlier filing date and right of priority to Korean Application No. 10-2019-0095605, filed on Aug. 6, 2019, the contents of which are all hereby incorporated by reference herein their entirety.

TECHNICAL FIELD

The present disclosure is applicable to the display device related technical fields and relates to a method of fabricating a display device using a micro Light Emitting Diode (LED) for example and transfer substrate used for display device fabrication.

BACKGROUND ART

Recently, in a field of a display technology, display devices having excellent characteristics such as thinness, flexibility, and the like have been developed. On the other hand, currently commercialized major displays are represented by a LCD (liquid crystal display) and an OLED (organic light emitting diode).

However, the LCD has a response time that is not fast, and is difficult to be flexibly implemented.

On the other hand, LED (light emitting diode), which is a well-known semiconductor light-emitting element that converts electric current into light, has been used as a light source for a display image of an electronic device including an information and communication device along with a GaP:N-based green LED, starting with commercialization of a red LED using a GaAsP compound semiconductor in 1962. Accordingly, a method for solving the above-described problems by implementing a display using the semiconductor light-emitting element may be proposed. Such light emitting diode has various advantages, such as long lifespan, low power consumption, excellent initial driving characteristics, high vibration resistance, and the like, compared to a filament-based light-emitting element.

However, in order to implement a large-area high-pixel display device using semiconductor light emitting elements, a very large number of semiconductor light emitting elements should be accurately assembled or transferred to a wiring substrate of the display device.

Accordingly, the present disclosure proposes a method of fabricating a display device in which a semiconductor light emitting element is transferred to a wiring substrate with a minimum arrangement error and a transfer substrate used in fabricating the display device.

DISCLOSURE

Technical Tasks

One technical task of the present disclosure is to provide a new fabricating method with high reliability in fabricating a display device using a semiconductor light emitting element.

Another technical task of the present disclosure is to provide a transfer substrate capable of minimizing an arrangement error during a transfer process in transferring a semiconductor light emitting element to fabricate a large-area display device and fabricating method thereof.

Further technical task of the present disclosure is to solve various problems unmentioned herein. Those of ordinary skill in the art may understand it through the full text of the specification and drawings.

Technical Solutions

In one technical aspect of the present disclosure, provided is a method of fabricating a transfer substrate, including preparing a mold in an intaglio shape corresponding to a stamp layer including a protrusion, injecting a mixed solution obtained by mixing a curing agent, an organic solution, and a multitude of inorganic fillers into the mold, fixing an upper surface of the mold having the mixed solution injected thereinto by contacting a base substrate, precipitating a multitude of the inorganic fillers of the mixed solution by gravity in a direction of the base substrate by turning the mold and the base substrate upside down, curing the mixed solution, and removing the mold.

The preparing the mold may include forming a first intaglio part corresponding to the stamp layer on a flat surface of a mold substrate and forming a second intaglio part corresponding to the protrusion on the first intaglio part.

The transferring to the second temporary substrate may include a step in which the second conductive semiconductor layer of the semiconductor light emitting element comes into contact with the protective layer of the second temporary substrate.

The curing the mixed solution may include controlling a concentration distribution of the inorganic fillers so that a concentration of a multitude of the inorganic fillers changes depending on a position in the mixed solution within the mold.

The controlling the concentration distribution of the inorganic fillers may include controlling the concentration of the inorganic fillers to increase as the position moves from the protrusion toward the base substrate in the mixed solution within the mold.

The curding the mixed solution may be performed in a temperature range between 70° C. and 120° C.

The controlling the concentration distribution of the inorganic fillers may include controlling a viscosity of the organic solution in the mixed solution through a temperature change or ultraviolet (UV) irradiation for the mixed solution injected into the mold.

The injecting the mixed solution may include mixing and dispersing the organic solution with a multitude of the inorganic fillers and adding the curing agent to the organic solution having a multitude of the inorganic fillers dispersed therein.

In another technical aspect of the present disclosure, provided is a transfer substrate used in fabricating a display device based on a semiconductor light emitting element, the transfer substrate including a base layer and an organic stamp layer having a protrusion located on the base layer, wherein the organic stamp layer may have a concentration gradient of inorganic fillers depending on a position when the organic fillers are dispersed within the organic stamp layer and wherein the concentration gradient of the inorganic fillers may gradually increase from the protrusion of the organic stamp layer toward the base layer.

The organic stamp layer may include a first region having the concentration gradient of the inorganic fillers and a second region having the organic fillers not existing therein. The second region may be located outside the first region and may include an end portion of the protrusion.

A first stiffness of the base layer may be greater than a second stiffness of the organic stamp layer and the second stiffness may be greater than a third stiffness of the second region of the organic stamp layer.

A height of the protrusion may be determined based on the semiconductor light emitting element coming in contact with the protrusion.

The height of the protrusion may be greater than a thickness in a stacking direction of the semiconductor light emitting element.

A width of the protrusion may be greater than that of the semiconductor light emitting element coming in contact with the protrusion.

The base layer may include at least one of polyethylene terephthalate (PET), polycarboxylate ether (PCE), or glass.

A main component of the inorganic fillers may include $SiO_2$ of several tens of nm to several μm.

A main component of the organic stamp layer may include polydimethylsiloxane (PDMS).

The semiconductor light emitting element may include a micrometer-unit LED (Micro-LED).

Advantageous Effects

According to one embodiment of the present disclosure, it is able to provide a new fabricating method with high reliability in fabricating a display device using a semiconductor light emitting element.

Specifically, as a transfer substrate to transfer a semiconductor light emitting element, an organic stamp layer including a protrusion is used. The organic stamp layer contains a multitude of inorganic fillers, and concentration of the inorganic filters is formed to increase in proportion to a distance from the protrusion. Hence, the protrusion of the inorganic stamp layer has low concentration of the inorganic fillers, thereby maintaining adhesion enough to transfer the semiconductor light emitting element. And, stiffness of the organic stamp layer is formed much stronger than that of a stamp layer that uses a single organic matter.

Accordingly, it is able to improve the precision of transfer by minimizing the arrangement error of the semiconductor light emitting elements due to deformation of the stamp layer generated during the transfer process.

Furthermore, according to another embodiment of the present disclosure, there are additional effects not mentioned herein. Those of ordinary skill in the art may understand it through the full text of the specification and drawings.

DESCRIPTION OF DRAWINGS

FIGS. 5A to 5C are conceptual diagrams illustrating various examples of color implementation with respect to a flip-chip type semiconductor light emitting element.

FIG. 20 shows a simulation result for an arrangement error according to a content of inorganic fillers, measured according to the model of FIG. 19.

BEST MODE FOR DISCLOSURE

Reference will now be made in detail to embodiments of the present disclosure, examples of which are illustrated in the accompanying drawings. Wherever possible, the same reference numbers will be used throughout the drawings to refer to the same or like parts, and redundant description thereof will be omitted. As used herein, the suffixes "module" and "unit" are added or used interchangeably to facilitate preparation of this specification and are not intended to suggest distinct meanings or functions. In describing embodiments disclosed in this specification, relevant well-known technologies may not be described in detail in order not to obscure the subject matter of the embodiments disclosed in this specification. In addition, it should be noted that the accompanying drawings are only for easy understanding of the embodiments disclosed in the present specification, and should not be construed as limiting the technical spirit disclosed in the present specification.

Furthermore, although the drawings are separately described for simplicity, embodiments implemented by combining at least two or more drawings are also within the scope of the present disclosure.

In addition, when an element such as a layer, region or module is described as being "on" another element, it is to be understood that the element may be directly on the other element or there may be an intermediate element between them.

The display device described herein is a concept including all display devices that display information with a unit pixel or a set of unit pixels. Therefore, the display device may be applied not only to finished products but also to parts. For example, a panel corresponding to a part of a digital TV also independently corresponds to the display device in the present specification. The finished products include a mobile phone, a smartphone, a laptop, a digital broadcasting terminal, a personal digital assistant (PDA), a portable multimedia player (PMP), a navigation system, a slate PC, a tablet, an Ultrabook, a digital TV, a desktop computer, and the like.

However, it will be readily apparent to those skilled in the art that the configuration according to the embodiments described herein is applicable even to a new product that will be developed later as a display device.

In addition, the semiconductor light emitting element mentioned in this specification is a concept including an LED, a micro LED, and the like.

Figure 1:
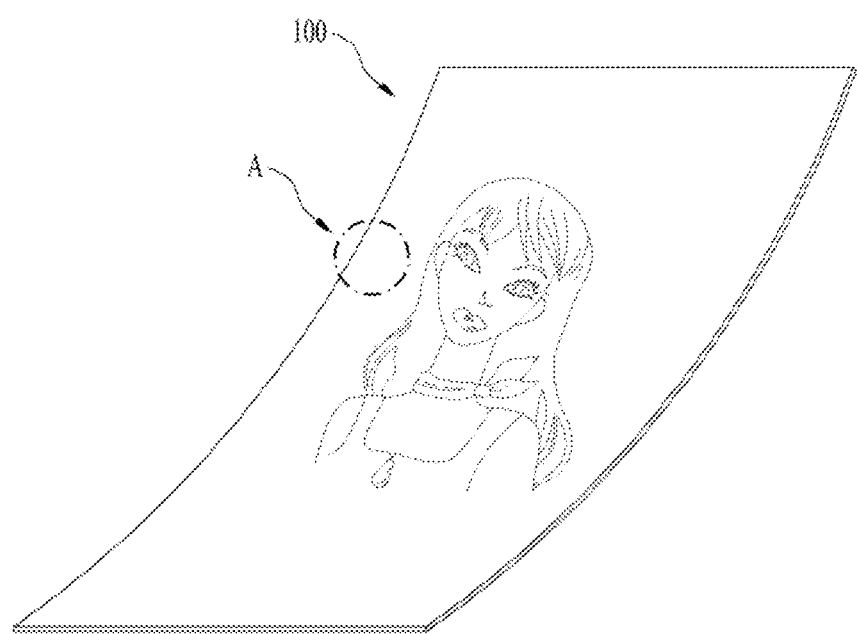
FIG. 1 is a conceptual diagram illustrating an embodiment of a display device using a semiconductor light emitting element according to the present disclosure.

FIG. 1 is a conceptual view illustrating an embodiment of a display device using a semiconductor light emitting element according to the present disclosure.

As shown in FIG. 1, information processed by a controller (not shown) of a display device 100 may be displayed using a flexible display.

The flexible display may include, for example, a display that can be warped, bent, twisted, folded, or rolled by external force.

Furthermore, the flexible display may be, for example, a display manufactured on a thin and flexible substrate that can be warped, bent, folded, or rolled like paper while maintaining the display characteristics of a conventional flat panel display.

When the flexible display remains in an unbent state (e.g., a state having an infinite radius of curvature) (hereinafter referred to as a first state), the display area of the flexible display forms a flat surface. When the display in the first sate is changed to a bent state (e.g., a state having a finite radius of curvature) (hereinafter referred to as a second state) by external force, the display area may be a curved surface. As shown in FIG. 1, the information displayed in the second state may be visual information output on a curved surface. Such visual information may be implemented by independently controlling the light emission of sub-pixels arranged in a matrix form. The unit pixel may mean, for example, a minimum unit for implementing one color.

The unit pixel of the flexible display may be implemented by a semiconductor light emitting element. In the present disclosure, a light emitting diode (LED) is exemplified as a type of the semiconductor light emitting element configured to convert electric current into light. The LED may be formed in a small size, and may thus serve as a unit pixel even in the second state.

Hereinafter, a flexible display implemented using the LED will be described in more detail with reference to the drawings.

Figure 2:
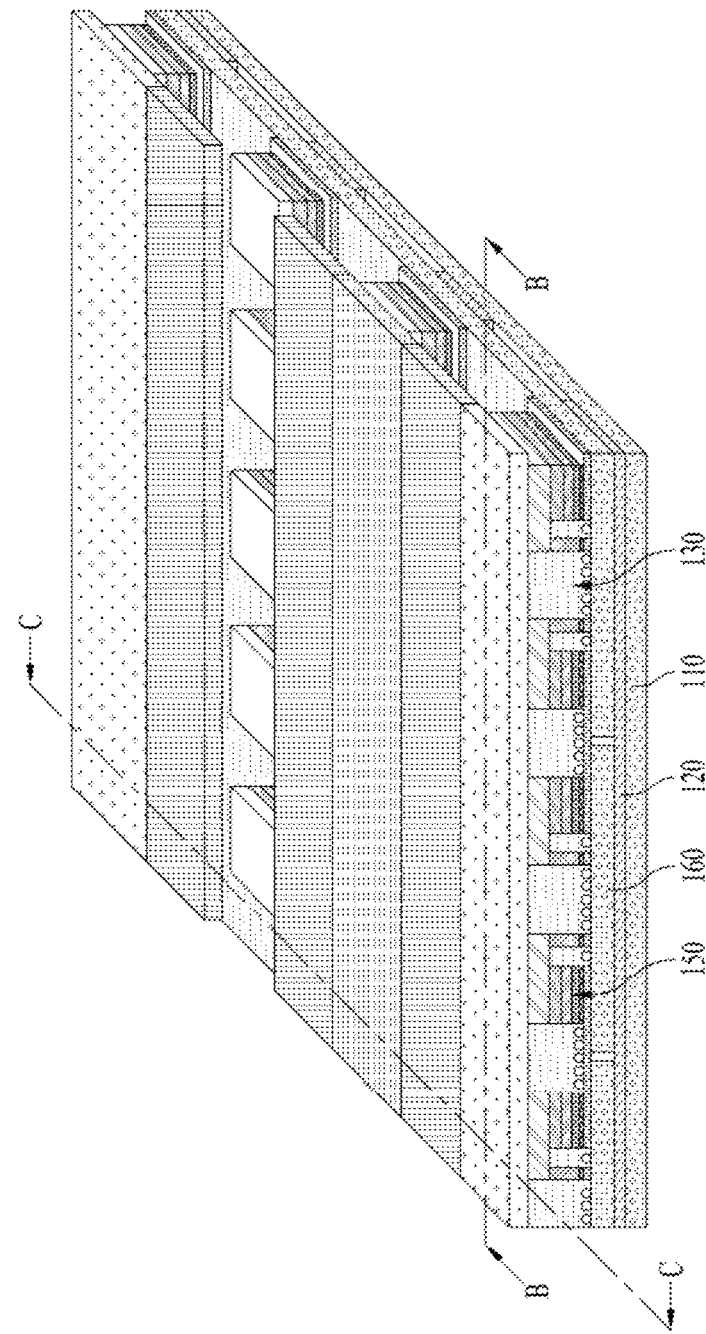
FIG. 2 is a partially enlarged diagram showing a part A shown in FIG. 1.

FIG. 2 is a partially enlarged view showing part A of FIG. 1.

Figure 3A:
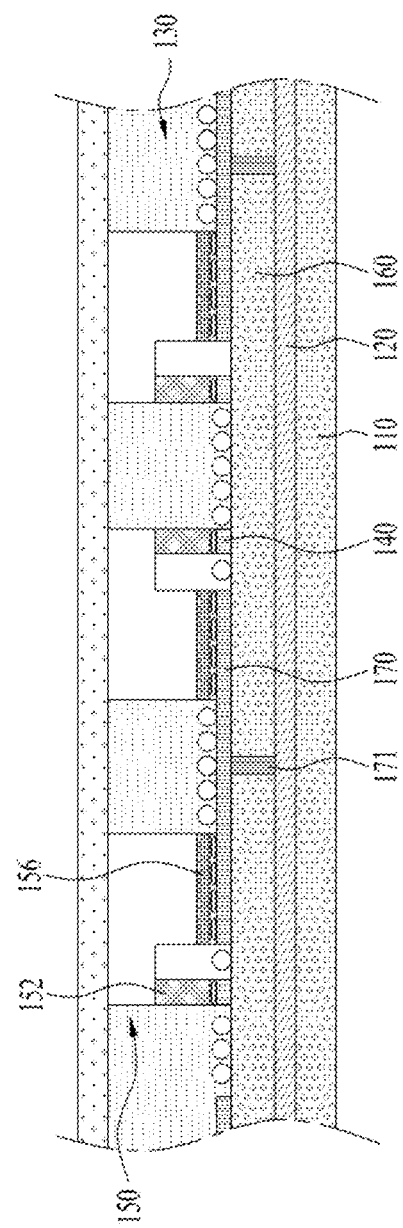
FIGS. 3A and 3B are cross-sectional diagrams taken along the cutting lines B-B and C-C in FIG. 2.
Figure 3B:
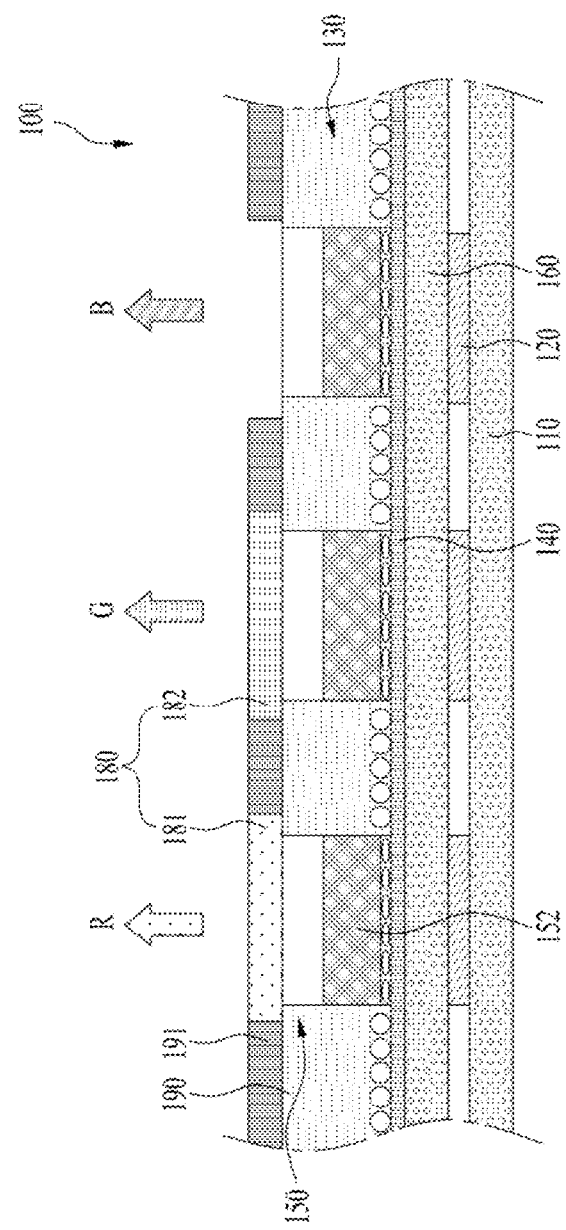

FIGS. 3A and 3B are cross-sectional views taken along lines B-B and C-C in FIG. 2.

Figure 4:
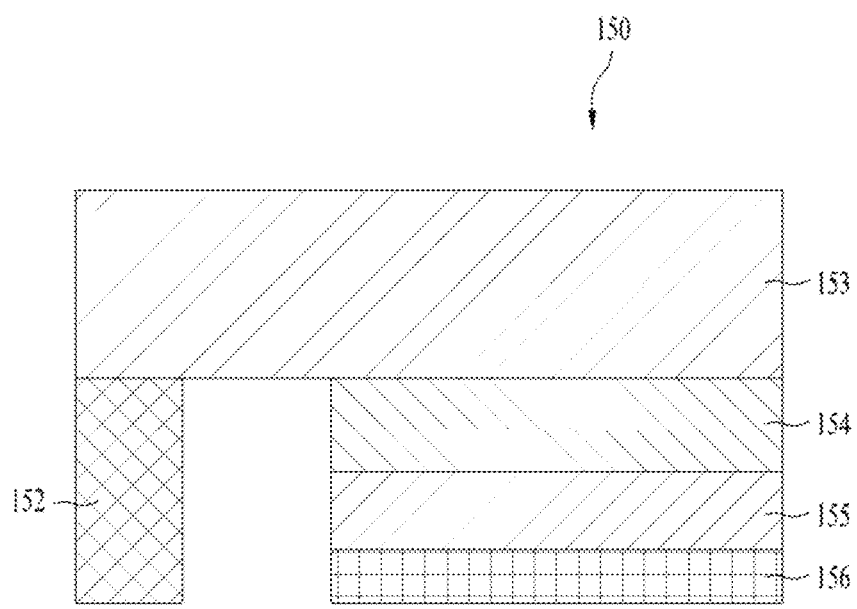
FIG. 4 is a conceptual diagram illustrating the flip-chip type semiconductor light emitting element of FIG. 3.

FIG. 4 is a conceptual view illustrating the flip-chip type semiconductor light emitting element of FIG. 3.

Figure 5C:
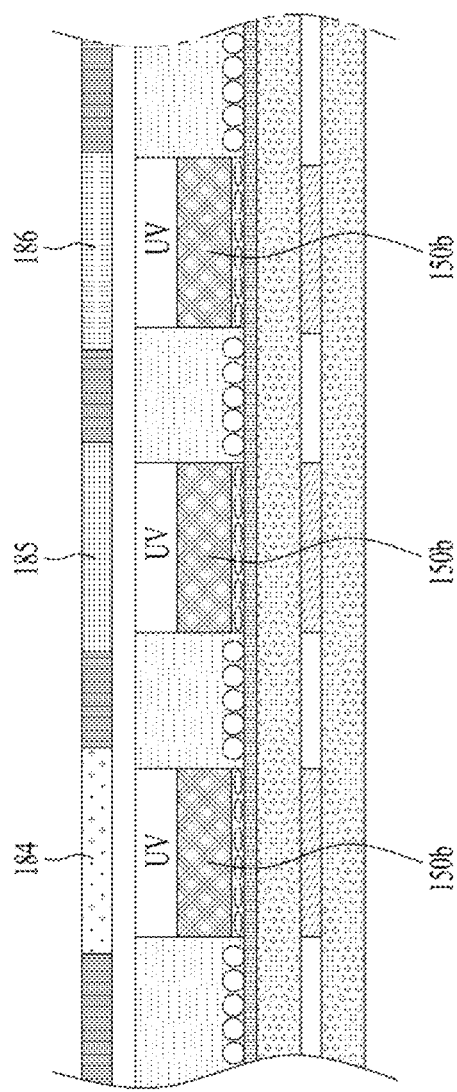

FIGS. 5A to 5C are conceptual views illustrating various examples of implementation of colors in relation to a flip-chip type semiconductor light emitting element.

As shown in FIGS. 2, 3A and 3B, the display device 100 using a passive matrix (PM) type semiconductor light emitting element is exemplified as the display device 100 using a semiconductor light emitting element. However, the examples described below are also applicable to an active matrix (AM) type semiconductor light emitting element.

The display device 100 shown in FIG. 1 may include a substrate 110, a first electrode 120, a conductive adhesive layer 130, a second electrode 140, and at least one semiconductor light emitting element 150, as shown in FIG. 2.

The substrate 110 may be a flexible substrate. For example, to implement a flexible display device, the substrate 110 may include glass or polyimide (PI). Any insulative and flexible material such as polyethylene naphthalate (PEN) or polyethylene terephthalate (PET) may be employed. In addition, the substrate 110 may be formed of either a transparent material or an opaque material.

The substrate 110 may be a wiring substrate on which the first electrode 120 is disposed. Thus, the first electrode 120 may be positioned on the substrate 110.

As shown in FIG. 3A, an insulating layer 160 may be disposed on the substrate 110 on which the first electrode 120 is positioned, and an auxiliary electrode 170 may be positioned on the insulating layer 160. In this case, a stack in which the insulating layer 160 is laminated on the substrate 110 may be a single wiring substrate. More specifically, the insulating layer 160 may be formed of an insulative and flexible material such as PI, PET, or PEN, and may be integrated with the substrate 110 to form a single substrate.

The auxiliary electrode 170, which is an electrode that electrically connects the first electrode 120 and the semiconductor light emitting element 150, is positioned on the insulating layer 160, and is disposed to correspond to the position of the first electrode 120. For example, the auxiliary electrode 170 may have a dot shape and may be electrically connected to the first electrode 120 by an electrode hole 171 formed through the insulating layer 160. The electrode hole 171 may be formed by filling a via hole with a conductive material.

As shown in FIG. 2 or 3A, a conductive adhesive layer 130 may be formed on one surface of the insulating layer 160, but embodiments of the present disclosure are not limited thereto. For example, a layer performing a specific function may be formed between the insulating layer 160 and the conductive adhesive layer 130, or the conductive adhesive layer 130 may be disposed on the substrate 110 without the insulating layer 160. In a structure in which the conductive adhesive layer 130 is disposed on the substrate 110, the conductive adhesive layer 130 may serve as an insulating layer.

The conductive adhesive layer 130 may be a layer having adhesion and conductivity. For this purpose, a material having conductivity and a material having adhesion may be mixed in the conductive adhesive layer 130. In addition, the conductive adhesive layer 130 may have ductility, thereby providing making the display device flexible.

As an example, the conductive adhesive layer 130 may be an anisotropic conductive film (ACF), an anisotropic conductive paste, a solution containing conductive particles, or the like. The conductive adhesive layer 130 may be configured as a layer that allows electrical interconnection in the direction of the Z-axis extending through the thickness, but is electrically insulative in the horizontal X-Y direction. Accordingly, the conductive adhesive layer 130 may be referred to as a Z-axis conductive layer (hereinafter, referred to simply as a "conductive adhesive layer").

The ACF is a film in which an anisotropic conductive medium is mixed with an insulating base member. When the ACF is subjected to heat and pressure, only a specific portion thereof becomes conductive by the anisotropic conductive medium. Hereinafter, it will be described that heat and pressure are applied to the ACF. However, another method may be used to make the ACF partially conductive. The other method may be, for example, application of only one of the heat and pressure or UV curing.

In addition, the anisotropic conductive medium may be, for example, conductive balls or conductive particles. For example, the ACF may be a film in which conductive balls are mixed with an insulating base member. Thus, when heat and pressure are applied to the ACF, only a specific portion of the ACF is allowed to be conductive by the conductive balls. The ACF may contain a plurality of particles formed by coating the core of a conductive material with an insulating film made of a polymer material. In this case, as the insulating film is destroyed in a portion to which heat and pressure are applied, the portion is made to be conductive by the core. At this time, the cores may be deformed to form layers that contact each other in the thickness direction of the film. As a more specific example, heat and pressure are applied to the whole ACF, and an electrical connection in the Z-axis direction is partially formed by the height difference of a counterpart adhered to the ACF.

As another example, the ACF may contain a plurality of particles formed by coating an insulating core with a conductive material. In this case, as the conductive material is deformed (pressed) in a portion to which heat and pressure are applied, the portion is made to be conductive in the thickness direction of the film. As another example, the conductive material may be disposed through the insulating base member in the Z-axis direction to provide conductivity in the thickness direction of the film. In this case, the conductive material may have a pointed end.

The ACF may be a fixed array ACF in which conductive balls are inserted into one surface of the insulating base member. More specifically, the insulating base member may be formed of an adhesive material, and the conductive balls may be intensively disposed on the bottom portion of the insulating base member. Thus, when the base member is subjected to heat and pressure, it may be deformed together with the conductive balls, exhibiting conductivity in the vertical direction.

However, the present disclosure is not necessarily limited thereto, and the ACF may be formed by randomly mixing conductive balls in the insulating base member, or may be composed of a plurality of layers with conductive balls arranged on one of the layers (as a double-ACF).

The anisotropic conductive paste may be a combination of a paste and conductive balls, and may be a paste in which conductive balls are mixed with an insulating and adhesive base material. Also, the solution containing conductive particles may be a solution containing any conductive particles or nanoparticles.

Referring back to FIG. 3A, the second electrode 140 is positioned on the insulating layer 160 and spaced apart from the auxiliary electrode 170. That is, the conductive adhesive layer 130 is disposed on the insulating layer 160 having the auxiliary electrode 170 and the second electrode 140 positioned thereon.

After the conductive adhesive layer 130 is formed with the auxiliary electrode 170 and the second electrode 140 positioned on the insulating layer 160, the semiconductor light emitting element 150 is connected thereto in a flip-chip form by applying heat and pressure. Thereby, the semiconductor light emitting element 150 is electrically connected to the first electrode 120 and the second electrode 140.

Referring to FIG. 4, the semiconductor light emitting element may be a flip chip-type light emitting device.

For example, the semiconductor light emitting element may include a p-type electrode 156, a p-type semiconductor layer 155 on which the p-type electrode 156 is formed, an active layer 154 formed on the p-type semiconductor layer 155, an n-type semiconductor layer 153 formed on the active layer 154, and an n-type electrode 152 disposed on the n-type semiconductor layer 153 and horizontally spaced apart from the p-type electrode 156. In this case, the p-type electrode 156 may be electrically connected to the auxiliary electrode 170, which is shown in FIG. 3, by the conductive adhesive layer 130, and the n-type electrode 152 may be electrically connected to the second electrode 140.

Referring back to FIGS. 2, 3A and 3B, the auxiliary electrode 170 may be elongated in one direction. Thus, one auxiliary electrode may be electrically connected to the plurality of semiconductor light emitting elements 150. For example, p-type electrodes of semiconductor light emitting elements on left and right sides of an auxiliary electrode may be electrically connected to one auxiliary electrode.

More specifically, the semiconductor light emitting element 150 may be press-fitted into the conductive adhesive layer 130 by heat and pressure. Thereby, only the portions of the semiconductor light emitting element 150 between the p-type electrode 156 and the auxiliary electrode 170 and between the n-type electrode 152 and the second electrode 140 may exhibit conductivity, and the other portions of the semiconductor light emitting element 150 do not exhibit conductivity as they are not press-fitted. In this way, the conductive adhesive layer 130 interconnects and electrically connects the semiconductor light emitting element 150 and the auxiliary electrode 170 and interconnects and electrically connects the semiconductor light emitting element 150 and the second electrode 140.

The plurality of semiconductor light emitting elements 150 may constitute a light emitting device array, and a phosphor conversion layer 180 may be formed on the light emitting device array.

The light emitting device array may include a plurality of semiconductor light emitting elements having different luminance values. Each semiconductor light emitting element 150 may constitute a unit pixel and may be electrically connected to the first electrode 120. For example, a plurality of first electrodes 120 may be provided, and the semiconductor light emitting elements may be arranged in, for example, several columns. The semiconductor light emitting elements in each column may be electrically connected to any one of the plurality of first electrodes.

In addition, since the semiconductor light emitting elements are connected in a flip-chip form, semiconductor light emitting elements grown on a transparent dielectric substrate may be used. The semiconductor light emitting elements may be, for example, nitride semiconductor light emitting elements. Since the semiconductor light emitting element 150 has excellent luminance, it may constitute an individual unit pixel even when it has a small size.

As shown in FIG. 3, a partition wall 190 may be formed between the semiconductor light emitting elements 150. In this case, the partition wall 190 may serve to separate individual unit pixels from each other, and may be integrated with the conductive adhesive layer 130. For example, by inserting the semiconductor light emitting element 150 into the ACF, the base member of the ACF may form the partition wall.

In addition, when the base member of the ACF is black, the partition wall 190 may have reflectance and increase contrast even without a separate black insulator.

As another example, a reflective partition wall may be separately provided as the partition wall 190. In this case, the partition wall 190 may include a black or white insulator depending on the purpose of the display device. When a partition wall including a white insulator is used, reflectivity may be increased. When a partition wall including a black insulator is used, it may have reflectance and increase contrast.

The phosphor conversion layer 180 may be positioned on the outer surface of the semiconductor light emitting element 150. For example, the semiconductor light emitting element 150 may be a blue semiconductor light emitting element that emits blue (B) light, and the phosphor conversion layer 180 may function to convert the blue (B) light into a color of a unit pixel. The phosphor conversion layer 180 may be a red phosphor 181 or a green phosphor 182 constituting an individual pixel.

That is, the red phosphor 181 capable of converting blue light into red (R) light may be laminated on a blue semiconductor light emitting element at a position of a unit pixel of red color, and the green phosphor 182 capable of converting blue light into green (G) light may be laminated on the blue semiconductor light emitting element at a position of a unit pixel of green color. Only the blue semiconductor light emitting element may be used alone in the portion constituting the unit pixel of blue color. In this case, unit pixels of red (R), green (G), and blue (B) may constitute one pixel. More specifically, a phosphor of one color may be laminated along each line of the first electrode 120. Accordingly, one line on the first electrode 120 may be an electrode for controlling one color. That is, red (R), green (G), and blue (B) may be sequentially disposed along the second electrode 140, thereby implementing a unit pixel.

However, embodiments of the present disclosure are not limited thereto. Unit pixels of red (R), green (G), and blue (B) may be implemented by combining the semiconductor light emitting element 150 and the quantum dot (QD) rather than using the phosphor.

Also, a black matrix 191 may be disposed between the phosphor conversion layers to improve contrast. That is, the black matrix 191 may improve contrast of light and darkness.

However, embodiments of the present disclosure are not limited thereto, and anther structure may be applied to implement blue, red, and green colors.

Referring to FIG. 5A, each semiconductor light emitting element may be implemented as a high-power light emitting device emitting light of various colors including blue by using gallium nitride (GaN) as a main material and adding indium (In) and/or aluminum (Al).

In this case, each semiconductor light emitting element may be a red, green, or blue semiconductor light emitting element to form a unit pixel (sub-pixel). For example, red, green, and blue semiconductor light emitting elements R, G, and B may be alternately disposed, and unit pixels of red, green, and blue may constitute one pixel by the red, green and blue semiconductor light emitting elements. Thereby, a full-color display may be implemented.

Referring to FIG. 5B, the semiconductor light emitting element 150a may include a white light emitting device W having a yellow phosphor conversion layer, which is provided for each device. In this case, in order to form a unit pixel, a red phosphor conversion layer 181, a green phosphor conversion layer 182, and a blue phosphor conversion layer 183 may be disposed on the white light emitting device W. In addition, a unit pixel may be formed using a color filter repeating red, green, and blue on the white light emitting device W.

Referring to FIG. 5C, a red phosphor conversion layer 181, a green phosphor conversion layer 185, and a blue phosphor conversion layer 183 may be provided on a ultraviolet light emitting device. Not only visible light but also ultraviolet (UV) light may be used in the entire region of the semiconductor light emitting element. In an embodiment, UV may be used as an excitation source of the upper phosphor in the semiconductor light emitting element.

Referring back to this example, the semiconductor light emitting element is positioned on the conductive adhesive layer to constitute a unit pixel in the display device. Since the semiconductor light emitting element has excellent luminance, individual unit pixels may be configured despite even when the semiconductor light emitting element has a small size.

Regarding the size of such an individual semiconductor light emitting element, the length of each side of the device may be, for example, 80 μm or less, and the device may have a rectangular or square shape. When the semiconductor light emitting element has a rectangular shape, the size thereof may be less than or equal to 20 μm×80 μm.

In addition, even when a square semiconductor light emitting element having a side length of 10 μm is used as a unit pixel, sufficient brightness to form a display device may be obtained.

Figure 6:
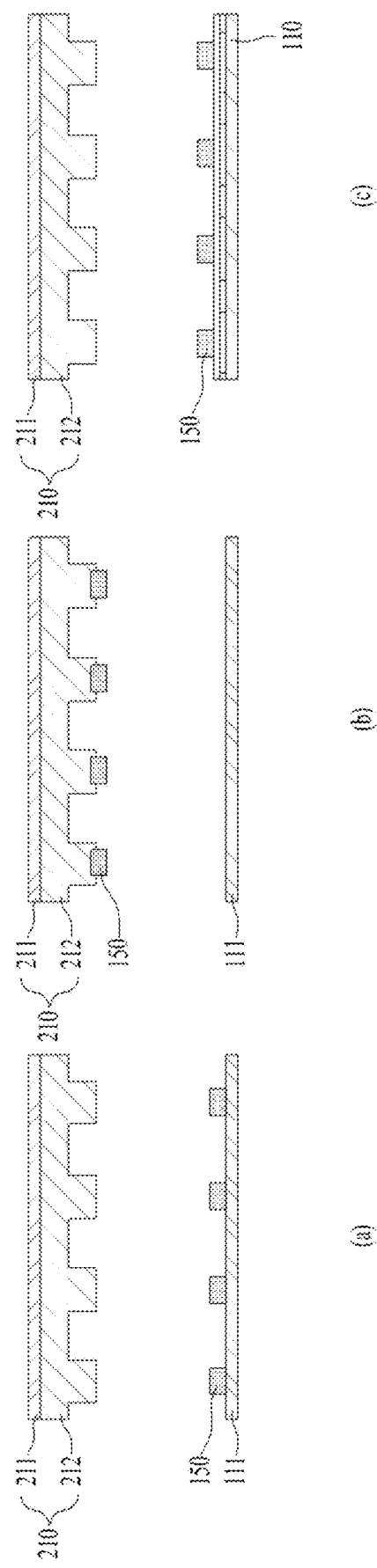
FIG. 6 shows cross-sectional views for a method of fabricating a display device using a transfer substrate of the present disclosure.

FIG. 6 shows cross-sectional views for a method of fabricating a display device using a transfer substrate of the present disclosure.

In case of a large-area high-pixel display device using semiconductor light emitting elements, the semiconductor light emitting element formed on a growth substrate should be assembled on or transferred to a new substrate. The growth substrate may include an 8-inch wafer for example, whereby a plurality of transfers may be repeated.

FIG. 6(a) is a cross-sectional diagram showing that a semiconductor light emitting element 150 formed on a growth substrate 111 and a transfer substrate 210 including a base layer 211 and an organic stamp layer 212 are aligned with each other upward and downward.

The semiconductor light emitting element 150 formed on the substrate 111 may include a first conductive semiconductor layer, a second conductive semiconductor layer, an active layer, and a conductive electrode deposited on each of the conductive semiconductor layers. The semiconductor light emitting element 150 may include a vertical semiconductor light emitting element having the conductive electrodes formed to confront each other or a horizontal semiconductor light emitting element having the conductive electrodes formed in the same direction.

In case of the vertical semiconductor light emitting element, a conductive electrode in one direction is formed on a growth substrate and a conductive electrode in another direction is then formed after a transfer. On the other hand, in case of the horizontal semiconductor light emitting element, all conductive electrodes may be formed on a growth substrate.

In addition, when the horizontal semiconductor light emitting element is transferred to a final wiring substrate, it may be transferred in a flip-chip structure.

In addition, the growth substrate 111 may be formed in a manner of containing a material having a light transmissive property, e.g., sapphire ($Al_2O_3$), GaN, ZnO, or AlO. The growth substrate 111 may be formed of a material suitable for semiconductor substance growth, e.g., carrier wafer. The growth substrate 111 may be formed of a substance of excellent thermal conductivity and may use at least one of SiC substrate, Si substrate, GaAs substrate, GaP substrate, InP substrate, and $Ga_2O_3$ substrate for example, which have thermal conductivity greater than that of sapphire (Al2O3) substrate, by including a conductive substrate or an insulative substrate, by which the present disclosure is non-limited.

In addition, the organic stamp layer 212 of the transfer substrate 210 has adhesion enough to transfer the semiconductor light emitting element 150.

The organic stamp layer 212 is provided with protrusions spaced apart from each other in a predetermined space to correspond to a disposed space of the semiconductor light emitting element of the growth substrate 11. In addition, for an accurate transfer between the protrusion and the semiconductor light emitting element, an alignment process may be performed.

The alignment process is performed in a manner of horizontally moving one of the growth substrate 111 and the transfer substrate 210 with respect to the other and then vertically moving it with respect to the other. Thereafter, it is checked whether a position of the semiconductor light emitting element 150 of the growth substrate 111 and a position of the protrusion of the transfer substrate 210 corresponding to the semiconductor light emitting element 150 overlap with each other. If the positions overlap with each other, the semiconductor light emitting element 150 is transferred to match the protrusion.

Referring to FIG. 6(b), the semiconductor light emitting element 150 is stably transferred to the protrusion in the organic stamp layer 212 of the transfer substrate 210.

The organic stamp layer 212 may include flexible material such as PDMS (polydimethylsiloxane), and the base layer 211 of the transfer substrate 210 may include at least one of PET (polyethylene terephthalate), PCE (polycarboxylate Ether) and glass. Hence, the base layer 211 may stably support the organic stamp layer 212 during the transfer process.

In addition, in the course of transferring the semiconductor light emitting element 150 to the transfer substrate 210 from the growth substrate 111, a Laser Lift Off (LLO) process may be performed to selectively separate the semiconductor light emitting element 150. Namely, if laser is applied to a specific area of the growth substrate 111 at which the semiconductor light emitting element 150 to separate is located, an interface of the specific area changes so that the semiconductor light emitting element 150 can be selectively separated from the growth substrate 111.

In addition, FIG. 6(c) is a cross-sectional diagram showing that the semiconductor light emitting element 150 has been transferred to a wiring substrate 110 from the organic stamp layer 212 of the transfer substrate.

As described above, in a substrate-to-substrate pressing step during a transfer, the base layer 211 of the transfer substrate 210 plays a role in stably supporting the organic stamp layer 212 of the transfer substrate 210.

In some implementations, an electrode unit for electrically connecting the semiconductor light emitting element 150 and the wiring substrate 110 together may be already formed on the wiring substrate 110. An adhesive layer for stably fixing the semiconductor light emitting element 150 to the wiring substrate 110 may be already formed on the wiring substrate 110. In addition, the adhesive layer is an anisotropic conductive adhesive layer for example, and a wiring process may be performed as soon as the semiconductor light emitting element 150 is transferred.

Meanwhile, in fabricating the display device using the transfer substrate 210 shown in FIG. 6, although the transfer process is mainly performed twice for example, the present disclosure is non-limited by the transfer count. For example, an addition transfer process may be performed to form a conductive electrode for a vertical semiconductor light emitting element or a light extraction structure of a semiconductor light emitting element. Moreover, although FIG. 6 shows a process for transferring a semiconductor light emitting element from a growth substrate to a transfer substrate, the semiconductor light emitting element of the growth substrate may be individually separated and then assembled to an assembly substrate in fluid by self-assembly. In this case, the semiconductor light emitting element assembled to the assembly substrate may be transferred to a transfer substrate provided with an organic stamp layer in a later process.

Figure 7:
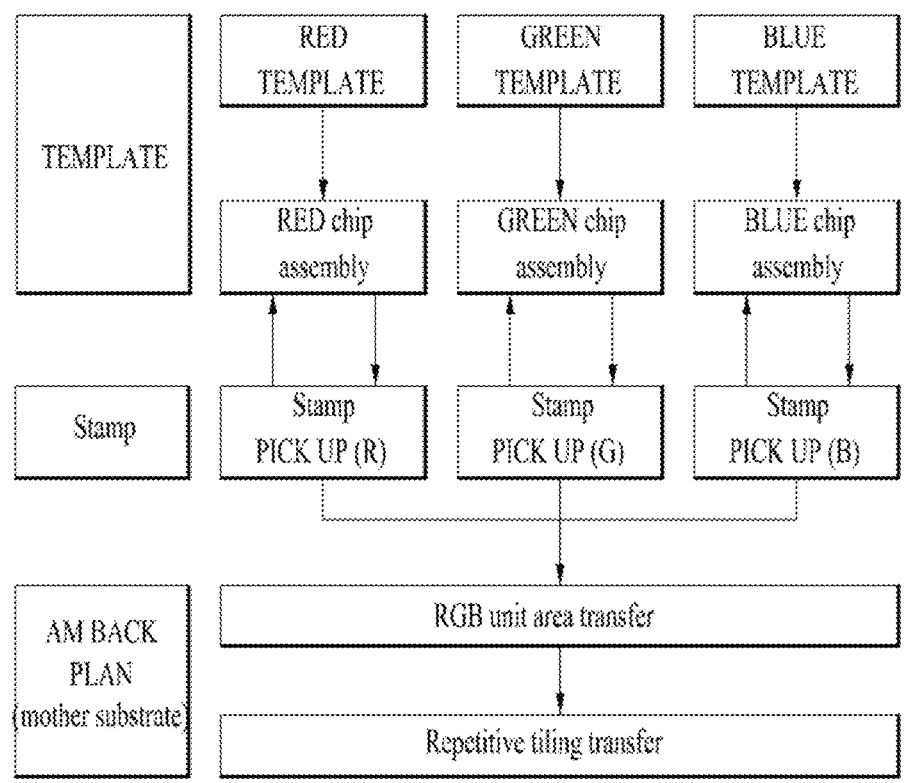
FIG. 7 is a flowchart showing a method of fabricating a display device including semiconductor light emitting elements emitting Red (R) light, Green (G) light and Blue (B) light, respectively.

FIG. 7 is a flowchart showing a method of fabricating a display device including semiconductor light emitting elements emitting Red (R) light, Green (G) light and Blue (B) light, respectively.

FIG. 7 specifically shows a process for fabricating a display device having a unit pixel by transferring subpixels of RGB, whereas FIG. 6 simply shows a process for transferring a semiconductor light emitting element in single color to a wiring substrate.

In the case of FIG. 7, a step of assembling semiconductor light emitting elements formed on a growth substrate to an assembly substrate by self-assembly is further performed. TEMPLATE shown in FIG. 7 means the assembly substrate.

According to a fabricating method shown in FIG. 7, assembly substrates of three types and transfer substrates of three types are required to fabricate a display device including a RED chip, a GREEN chip and a BLUE chip.

Specifically, the assembly substrates may include a RED assembly substrate for assembling RED semiconductor light emitting elements, a GREEN assembly substrate for assembling GREEN semiconductor light emitting elements, and a BLUE assembly substrate for assembling BLUE semiconductor light emitting elements.

The semiconductor light emitting elements assembled to the assembly substrates may be transferred to a wiring substrate via different transfer substrates, respectively.

For example, a process for transferring the semiconductor light emitting elements assembled to the assembly substrates to the wiring substrate may include a step of transferring the RED semiconductor light emitting element from the RED assembly substrate to a RED transfer substrate (stamp R) by compressing the RED transfer substrate (stamp R) to the RED assembly substrate, a step of transferring the GREEN semiconductor light emitting element from the GREEN assembly substrate to a GREEN transfer substrate (stamp G) by compressing the GREEN transfer substrate (stamp G) to the GREEN assembly substrate, and a step of transferring the BLUE semiconductor light emitting element from the BLUE assembly substrate to a BLUE transfer substrate (stamp B) by compressing the BLUE transfer substrate (stamp B) to the BLUE assembly substrate, Thereafter, a process for transferring the RED semiconductor light emitting element, the GREEN semiconductor light emitting element and the BLUE semiconductor light emitting element to the wiring substrate by compressing the respective transfer substrates to the wiring substrate is performed.

Alternatively, semiconductor light emitting elements respectively corresponding to RED, GREEN and BLUE may be transferred to a wiring substrate using assembly substrates of three types and a single transfer substrate.

For example, a step of transferring semiconductor light emitting elements assembled to assembly substrates of three types may be performed in a manner of transferring the semiconductor light emitting elements assembled to the respective assembly substrates to a single transfer substrate (e.g., an RGB integrated stamp) and then transferring all the semiconductor light emitting elements of the three types to a wiring substrate by compressing the transfer substrate to the wiring substrate.

Alternatively, semiconductor light emitting elements corresponding to RED, GREEN and BLUE may be transferred to a wiring substrate using an assembly substrate of one type and a transfer substrate of one type. In this case, during self-assembly, all the semiconductor light emitting elements respectively corresponding to RED, GREEN and BLUE are assembled to a single assembly substrate, and a process for transferring them to a transfer substrate and a wiring substrate collectively is then performed.

Thus, in order to implement a display device using semiconductor light emitting elements, countless RED, GREEN and BLUE semiconductor light emitting elements undergo a plurality of transfer processes.

The transfer process is not performed individually on each semiconductor light emitting element but is performed collectively on a predetermined amount of semiconductor light emitting elements via a transfer substrate. Hence, the transfer substrate includes a contact portion for transferring a plurality of semiconductor light emitting elements, e.g., a plurality of protrusions.

In addition, the protrusion should have adhesion over a predetermined level so as to transfer the semiconductor light emitting element to the transfer substrate by coming into contact with the semiconductor light emitting element.

Figure 8:
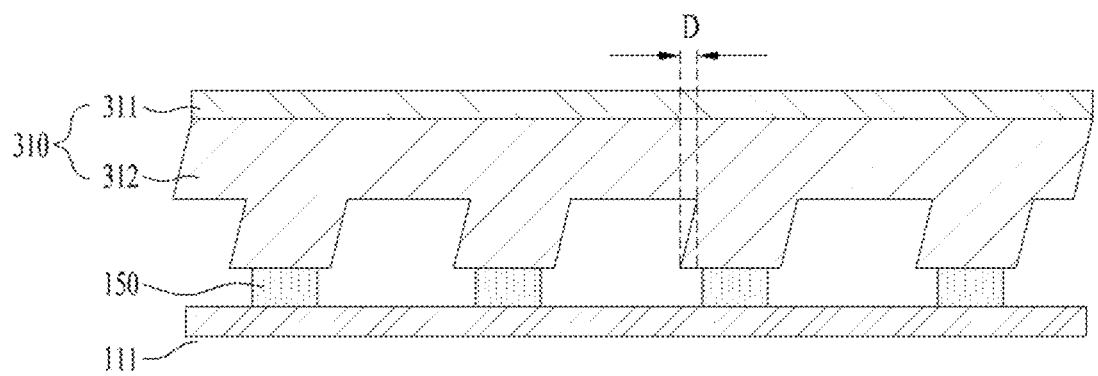
FIG. 8 is a diagram showing a semiconductor light emitting element arrangement error possibly occurring in transferring to a transfer substrate of the related art.

FIG. 8 is a diagram showing a semiconductor light emitting element arrangement error possibly occurring in transferring to a transfer substrate of the related art.

A transfer substrate of the related art is fabricated using organic substance such as PDMS and includes a plurality of protrusions to transfer individual semiconductor light emitting elements.

Although FIG. 8 is a cross-sectional diagram showing that a semiconductor light emitting element 150 formed on a growth substrate 111 is transferred to a transfer substrate 310, as described above, the semiconductor light emitting element 150 may be transferred to the transfer substrate 310 from an assembly substrate as well.

The transfer substrate is provided with an organic stamp layer 312 including protrusions and a base layer 311. Regarding the differences from the present disclosure described later, the organic stamp layer 312 has no difference in stiffness according to a position within the organic stamp layer even if formed of a single organic substance or mixture.

Therefore, as shown in FIG. 8, in case that the growth substrate 111 and the transfer substrate 310 are compressed together, the organic stamp layer 312 may change in shape. Since the compression process is accompanied by heat and pressure in general, as the transfer process is repeated, the degree of change of the organic stamp layer 312 may increase.

For example, as shown in FIG. 8, an arrangement error corresponding to D may occur. The 'D' occurs when the protrusion of the organic stamp layer 312 is bent at a predetermined slope, and accordingly, the semiconductor light emitting element may be transferred with an arrangement error corresponding to D.

Assuming that the size of the semiconductor light emitting element used in the display device is tens of μm, it is not a big problem from the viewpoint of defects if the arrangement error is hundreds of nm, but if the arrangement error is several μm, the arrangement error causes defects in subsequent processes after transfer.

For example, when the width length of a semiconductor light emitting element transferred to a wiring substrate (i.e., the length of the semiconductor light emitting element in a direction parallel to the substrate) is at the level of 50 μm, the arrangement error should be managed up to ±3 μm, which is the most important key factor in panel process yield.

Therefore, there is a need for a transfer substrate capable of transferring a semiconductor light emitting element well while minimizing deformation of an organic stamp layer during a transfer process.

Figure 9:
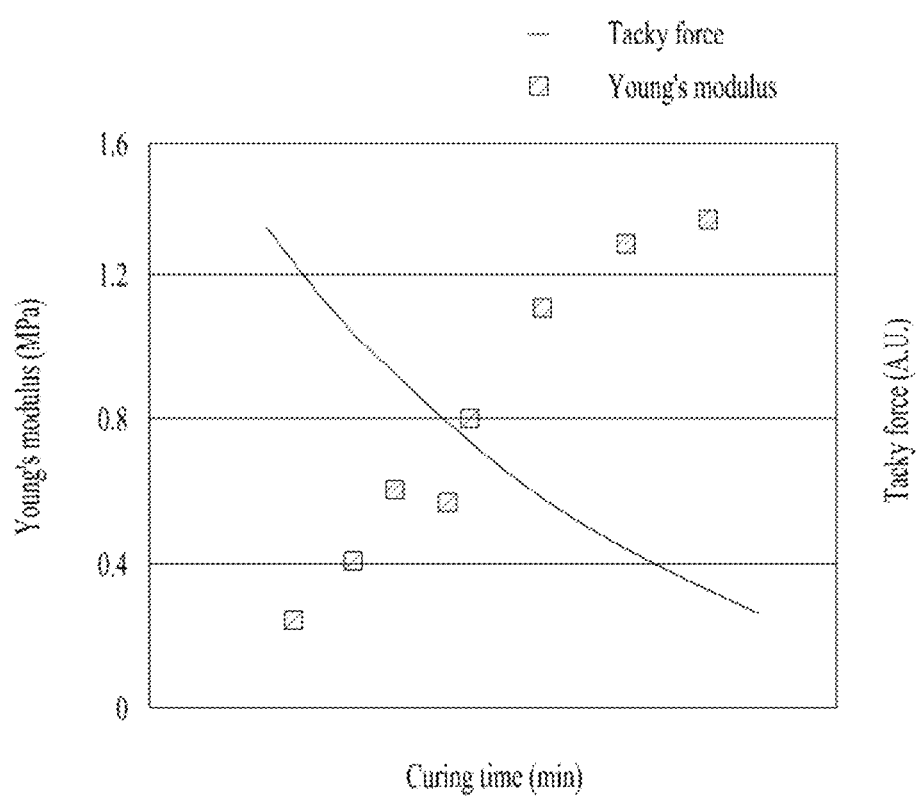
FIG. 9 is a graph showing the relation between Young's modulus and adhesion.

FIG. 9 is a graph showing the relation between Young's modulus and adhesion.

As shown in FIG. 9, Young's modulus is inverse proportional to adhesion.

The Young's modulus is a mechanical property that measures the stiffness of a solid material under a predetermined pressure. Specifically, the Young's modulus is an elastic coefficient that defines a relationship between stress and strain rate of a linear elastic material in a short axis deformation region, and may be expressed as F (stress)=E (Young's modulus)×S (strain rate) for example.

Therefore, in the case of a material having a high Young's modulus, the strain rate is small under the same pressure.

Meanwhile, the tacky force shown in FIG. 9 means adhesion, and in the case of an organic material, the sticky properties of a surface differ depending on to the extent of curing.

Looking into the graph of FIG. 9, as the curing time elapses, an organic material changes in a direction, in which Young's modulus increases but in which a tacky force decreases. Namely, as the organic material is cured, an extent of deformation under the same pressure decreases and adhesion is reduced.

Therefore, when an organic stamp layer of a transfer substrate is formed using the organic material based on the above results, a strain rate according to the same pressure may increase as the stamp layer comes into contact with a semiconductor light emitting element and has sufficient adhesion to transfer the semiconductor light emitting element. That is, the stamp layer having excellent adhesion is susceptible to deformation during the transfer process, and accordingly, an arrangement error may occur.

On the other hand, in the case of a stamp layer having a low strain rate, sufficient adhesion to transfer may not be guaranteed, and thus a transfer success rate of a semiconductor light emitting element may be reduced.

Figure 10:
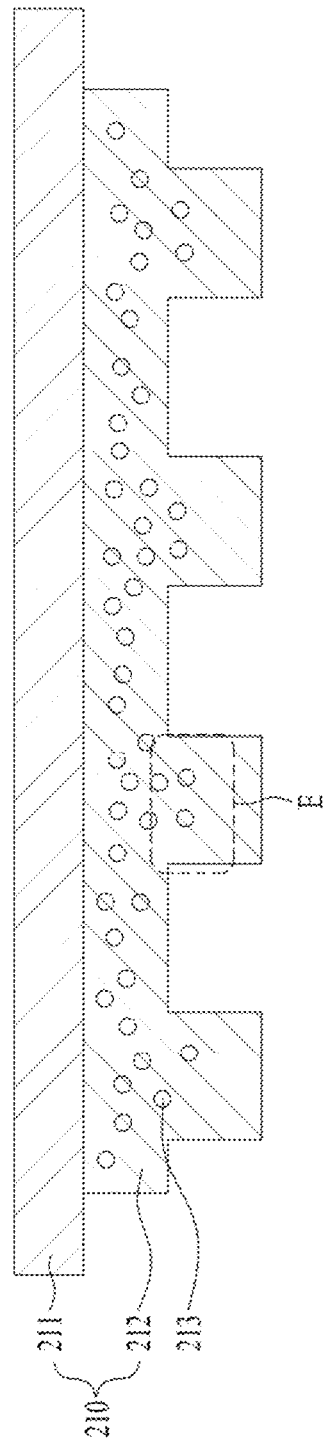
FIG. 10 is a cross-sectional diagram of a transfer substrate according to the present disclosure.

FIG. 10 is a cross-sectional diagram of a transfer substrate according to the present disclosure.

A transfer substrate 210 of FIG. 10 is a transfer substrate having adhesion capable of transferring a semiconductor light emitting element well while minimizing deformation of an organic stamp layer 212 during a transfer process.

As shown in FIG. 10, the transfer substrate 210 includes a base layer 211 and an organic stamp layer 212 located on the base layer 211 and having a protrusion.

The organic stamp layer 212 contains a multitude of inorganic fillers 213 and the concentration of the inorganic fillers 213 differ depending on a location within the stamp layer 212.

Specifically, the concentration gradient of the inorganic filler 213 is characterized in gradually increasing from the protrusion of the organic stamp layer 212 toward the base layer 211.

In addition, the height of the protrusion of the organic stamp layer 212 may be determined based on the thickness of a semiconductor light emitting element coming into contact with the protrusion. For example, the height of the protrusion is greater than the thickness of the semiconductor light emitting element. If the height of the protrusion is too small compared to the thickness of the semiconductor light emitting element, it is difficult for the semiconductor light emitting element to be transferred stably by adhering to the protrusion. In addition, as described above, the semiconductor light emitting element may be a horizontal semiconductor light emitting element or a vertical semiconductor light emitting element, and the thickness of the semiconductor light emitting element is proportional to a thickness at which a semiconductor layer is stacked when the semiconductor light emitting element is formed on a growth substrate.

In addition, the width of the protrusion is formed to be wider than the width of the semiconductor light emitting element coming into contact with the protrusion. For example, since the width of a horizontal semiconductor light emitting element is about 50 μm or less, the width of the protrusion is formed to be 50 μm or more so that the semiconductor light emitting element and the protrusion can stably come into contact with each other.

In addition, the thickness of the base layer 211 may be formed greater than the thickness of the organic stamp layer 212. For example, if the stiffness of the organic stamp layer 212 is smaller than that of the base layer 211, the thickness of the base layer 211 should be thicker than the thickness of the organic stamp layer 212, so that the strain rate of the organic stamp layer 212 may be small while the pressure applied above the base layer 211 is well transmitted to the organic stamp layer 212.

In addition, the base layer 211 may include at least one of polyethylene terephthalate (PET), polycarboxylate ether (PCE), and glass, and a main component of the organic stamp layer 212 may be polydimethylsiloxane (PDMS). Additionally, the main component of the inorganic filler 213 may be $SiO_2$ within several tens of nm to several μm. However, the main materials of the base layer 211, the organic stamp layer 212, and the inorganic filler 213 are exemplary, by which the present disclosure is non-limited, and various materials may be selected at a level that can be recognized by those skilled in the art.

Figure 11:
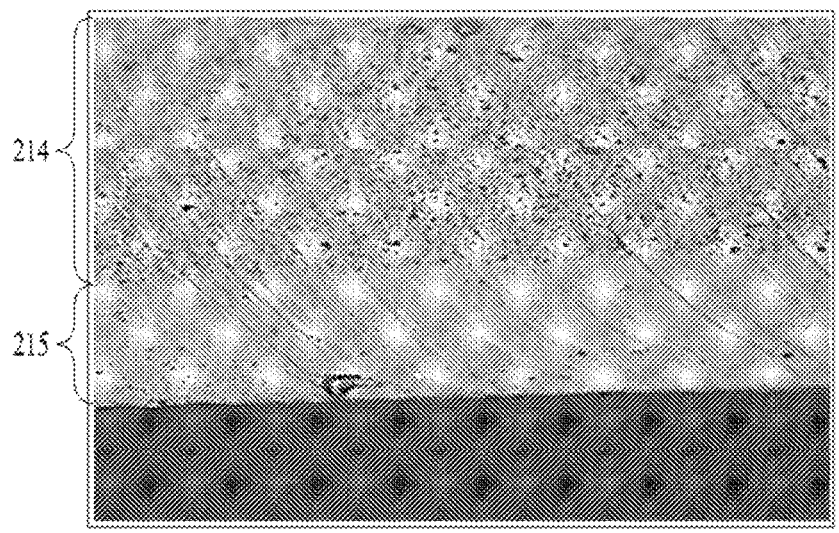
FIG. 11 is an image of an area E of the transfer substrate shown in FIG. 10, enlarged with an optical microscope.

FIG. 11 is an image of an area E of the transfer substrate shown in FIG. 10, enlarged with an optical microscope.

FIG. 11 is a cross-sectional image of a protrusion of an actually formed organic stamp layer. As shown in FIG. 11, the protrusion includes a first region 214 having a multitude of inorganic fillers dispersed therein and a second region 215 in which the inorganic filler barely exists therein. A diagonal shape additionally shown in FIG. 11 is an artifact formed by cutting the organic stamp layer.

According to the concentration distribution of the inorganic filler, stiffness of the first region 214 in which a large amount of the inorganic filler is distributed may be greater than that of the second region 215. More specifically, a first stiffness of a base layer of a transfer substrate may be greater than a second stiffness of the first region 214, and the second stiffness may be greater than a third stiffness of the second region 215 of the organic stamp layer.

Figure 12:
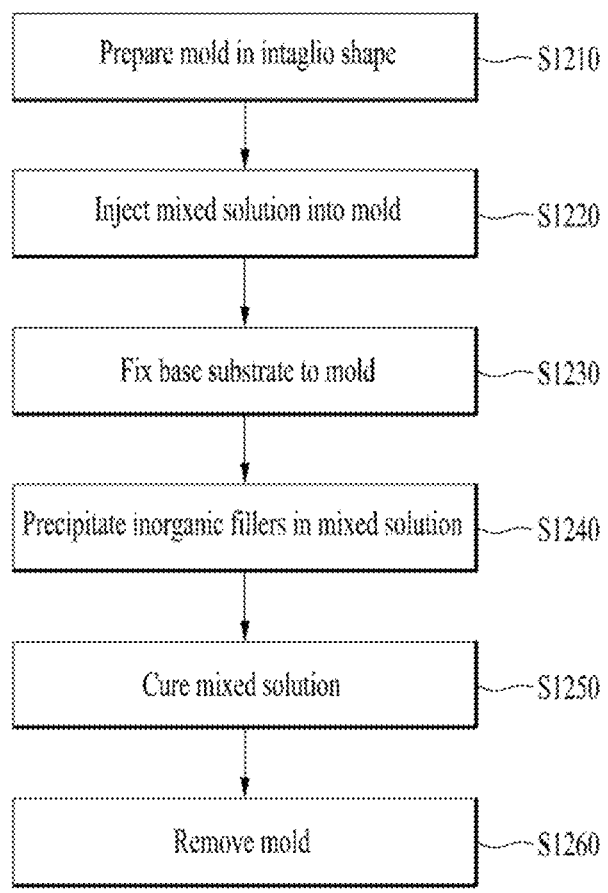
FIG. 12 is a flowchart showing a method of fabricating a transfer substrate according to the present disclosure.

FIG. 12 is a flowchart showing a method of fabricating a transfer substrate according to the present disclosure.

First of all, an intaglio-shaped mold corresponding to a stamp layer including a protrusion is prepared (S1210). The main material of the mold may be one of metal, Si, glass, or sapphire. In addition, a plurality of intaglio portions corresponding to the protrusions may be formed.

The step S1210 of preparing the mold includes a photo process and an etching process. For example, a first intaglio part corresponding to the stamp layer is etched on a flat surface of a mold substrate, and then a second intaglio part corresponding to the protrusion is formed on the first intaglio part. In order to selectively form only the second intaglio part on the first intaglio part, the remaining region except for the region where the second intaglio part is formed may be protected by a photoresist.

Thereafter, a mixed solution obtained by mixing a curing agent, an organic solution, and a multitude of inorganic fillers is injected into the mold (S1220). The step S1220 of injecting the mixed solution may further include a step of mixing and dispersing the organic solution with a multitude of the inorganic fillers and a step of adding the curing agent to the organic solution in which a multitude of the inorganic fillers are dispersed.

In addition, in the step of mixing and dispersing the inorganic fillers, a process of uniformly mixing the inorganic fillers until a solvent is evaporated at a low temperature of 50° C. or less may be added. When the amount of the solvent is too large, a precipitation rate of the inorganic fillers is fast, and thus it is preferable to use a solvent volatilized at a low temperature. The reason is, as will be described later, that a precipitation direction of the inorganic fillers is preferably directed toward a base substrate fixed onto the mold, not the protrusion of the intaglio part.

In addition, the step of adding the curing agent includes a step of removing air bubbles generated according to the addition of the curing agent.

Thereafter, an upper surface of the mold into which the mixed solution is injected is fixed by contacting the base substrate (S1230). The mixed solution is injected into the intaglio part of the mold, and an outermost edge of the mold contacts the base substrate. Through the step S1230 of fixing the base substrate, the mixed solution does not leak out of the base substrate and the mold.

Subsequently, the mold and the base substrate are turned upside down so that the inorganic fillers of the mixed solution are precipitated by gravity in the direction of the base substrate (S1240). The mixed solution injected into the intaglio part formed in the mold is cured and finally converted into an organic stamp layer. Therefore, through the precipitation step S1240, the concentration of the inorganic fillers is relatively small in the protrusion of the organic stamp layer, and the concentration of the inorganic fillers near the organic stamp layer contacting the base substrate is relatively large. Accordingly, the organic stamp layer generally has high stiffness owing to the inorganic fillers, and since there are almost no inorganic fillers in the protrusion, the stiffness is weak and the organic stamp layer may have excellent adhesion.

Thereafter, the mixed solution in the mold is cured (S1250). The step S1250 of curing the mixed solution includes a step of controlling the concentration distribution of the inorganic fillers in the mixed solution in the mold so that the concentration of a multitude of the inorganic fillers varies depending on positions.

Specifically, in the step of controlling of the concentration distribution of the inorganic fillers, the concentration of the inorganic fillers is controlled to increase as a position moves from the protrusion toward the base substrate in the mixed solution in the mold. In addition, the step of curing the mixed solution may be performed in a temperature range of 70 to 120° C. In some cases, the temperature may be heated below a temperature at which the mixed solution starts to be cured to increase fluidity of the organic solution, thereby increasing a precipitation rate of the inorganic fillers in the mixed solution.

Thus, the step of controlling the concentration distribution of the inorganic fillers includes a step of controlling the precipitation rate of the inorganic fillers. Specifically, for the mixed solution injected into the mold, through a temperature change or ultraviolet (UV) irradiation, a step of controlling the viscosity of the organic solution in the mixed solution may be included during a curing process.

Finally, when curing of the mixed solution is completed, the mold is removed (S1260).

Meanwhile, in light of the purpose of the present specification, it is also within the scope of other rights of the present disclosure to delete and change some steps of the flowchart shown in FIG. 12 at a level understandable to those skilled in the art.

Figure 13:
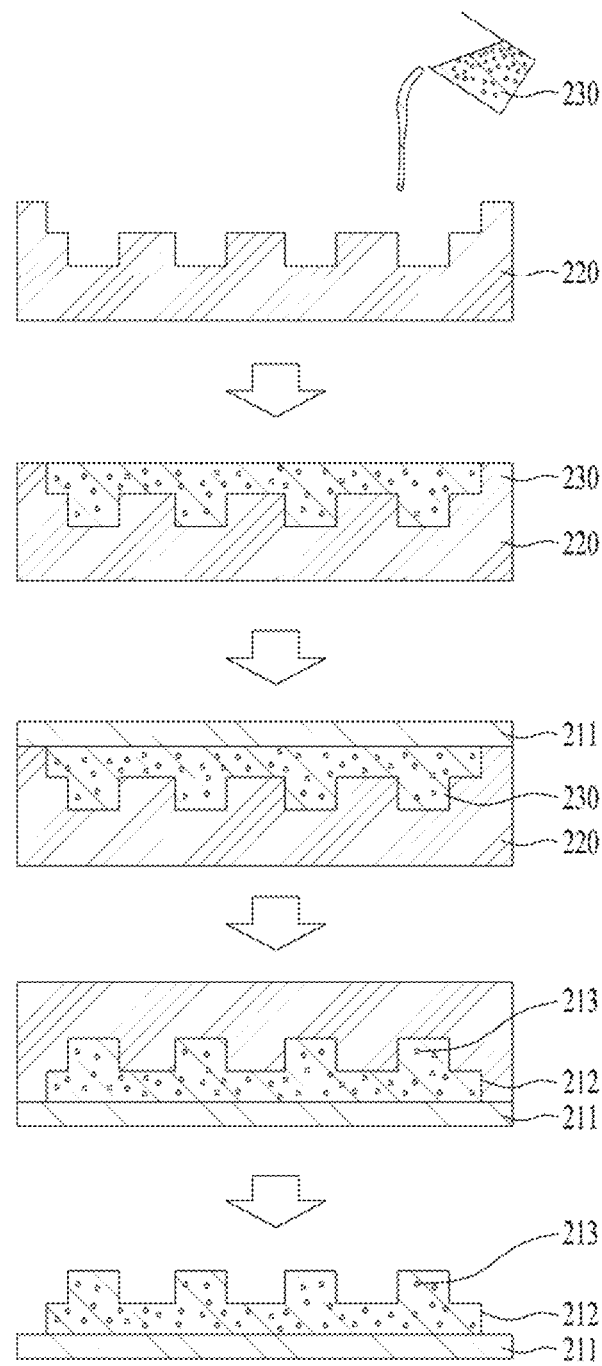
FIG. 13 shows cross-sectional views for the fabricating method according to the flowchart of FIG. 12.

FIG. 13 shows cross-sectional views for the fabricating method according to the flowchart of FIG. 12.

As shown in FIG. 13, a mixed solution 230 in which an organic solution, a curing agent, and inorganic fillers are mixed is injected into a mold 220 in which an intaglio part is formed.

The mixed solution 230 with which the intaglio part of the mold 220 is filled is then enclosed by a base substrate 211 coming in contact with an upper surface of the mold.

After inverting the mold 220 and the base substrate 211 so that the inorganic fillers 213 in the mixed solution 230 can face the base substrate 211, the mixed solution 230 is cured.

Finally, if the mold 230 is removed, a transfer substrate including an organic stamp layer 212 including a protrusion formed on the base substrate 211 is formed. In addition, the inorganic fillers 213 are dispersed in the organic stamp layer 212, and the concentration of the inorganic fillers 213 is characterized in tending to increase from the protrusion toward the base substrate 211.

Figure 14:
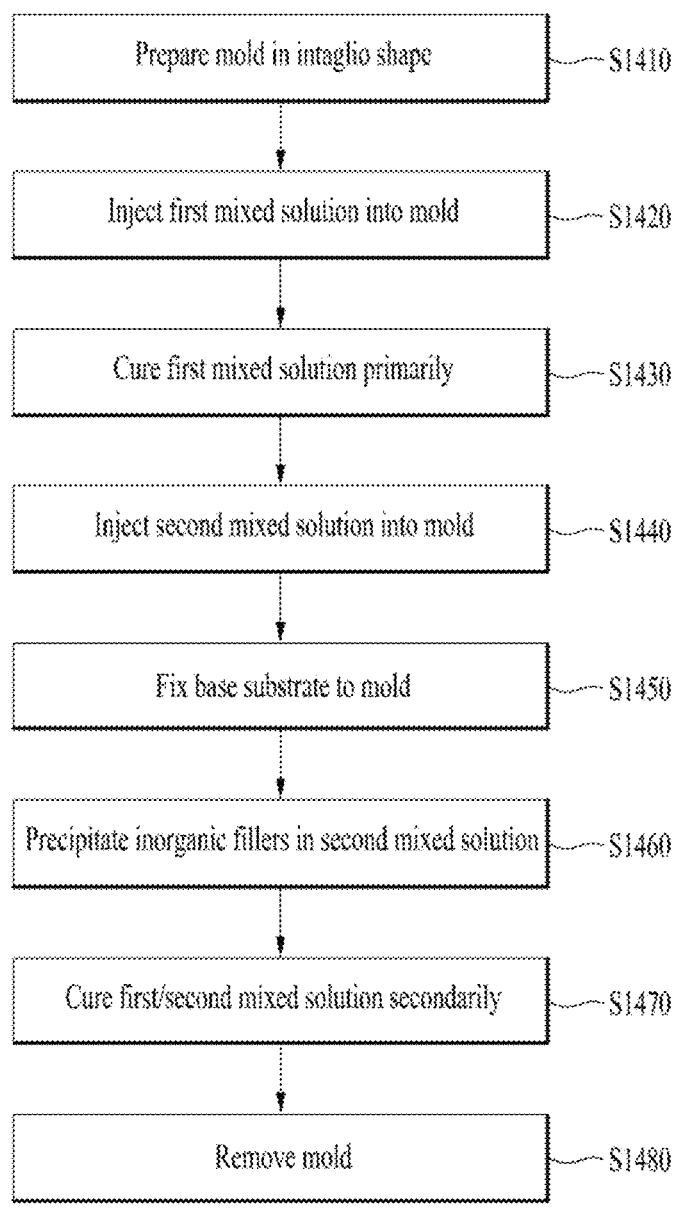
FIG. 14 is a flowchart showing a method of fabricating a transfer substrate according to another embodiment of the present disclosure.

FIG. 14 is a flowchart showing a method of fabricating a transfer substrate according to another embodiment of the present disclosure.

First of all, an intaglio-shaped mold corresponding to a stamp layer including a protrusion is prepared (S1410). The main material of the mold may be one of metal, Si, glass, or sapphire. In addition, a plurality of intaglio portions corresponding to the protrusions may be formed.

The step S1410 of preparing the mold includes a photo process and an etching process. For example, a first intaglio part corresponding to the stamp layer is etched on a flat surface of a mold substrate, and then a second intaglio part corresponding to the protrusion is formed on the first intaglio part. In order to selectively form only the second intaglio part on the first intaglio part, the remaining region except for the region where the second intaglio part is formed may be protected by a photoresist.

Thereafter, a first mixed solution including a first curing agent and a first organic solution is coated on the mold (S1420). The coating process may adjust the thickness of the coated first mixed solution through spray coating or spin coating.

Subsequently, the first mixed solution is primarily cured (S1430). Accordingly, the primarily cured mixed solution is composed of a simple organic material having no inorganic fillers existing therein. The organic material may be PDMS.

Thereafter, a second mixed solution including a second curing agent, a second organic solution, and inorganic fillers is injected into an upper portion of the first mixed solution having been cured primarily (S1440). The second mixed solution injecting step S1440 may include a step of mixing and dispersing a plurality of the inorganic fillers in the second organic solution and a step of adding the second curing agent to the second organic solution where a plurality of the inorganic fillers are dispersed.

In addition, in the step of mixing and dispersing the inorganic fillers, a process of uniformly mixing the inorganic fillers until the solvent is evaporated at a low temperature of 50° C. or less may be added. When an amount of a solvent is too large, the precipitation rate of the inorganic fillers is fast, and thus it is preferable to use a solvent volatilized at a low temperature. The reason is, as will be described later, that the precipitation direction of the inorganic fillers is preferably directed toward the base substrate fixed on the mold, not the protrusion of the intaglio part.

In addition, the step of adding the second curing agent includes a step of removing air bubbles generated by the addition of the second curing agent.

Thereafter, the upper surface of the mold into which the second mixed solution is injected is fixed by contacting the base substrate (S1450). The first mixed solution and the second mixed solution are present in an intaglio part of the mold, and an outermost edge of the mold comes into contact with the base substrate. Through the step S1450 of fixing the base substrate, the mixed solutions do not leak out of the base substrate and the mold.

Subsequently, the mold and the base substrate are turned upside down so that the inorganic fillers of the second mixed solution are precipitated by gravity in the direction of the base substrate (S1460). The mixed solutions injected into the intaglio part formed in the mold are cured and finally converted into an organic stamp layer. Therefore, through the precipitation step S1460, a region where the inorganic fillers are not present and a region where the concentration of the inorganic fillers is relatively small are formed in the protrusion of the organic stamp layer, and the concentration of the inorganic fillers in the organic stamp layer contacting the base substrate in the vicinity is relatively large. Accordingly, the organic stamp layer generally has high stiffness owing to the inorganic fillers overall, but since the inorganic fillers are not present at an end portion of the protrusion, the end portion may have weak stiffness and excellent adhesion.

Thereafter, the first mixed solution and the second mixed solution in the mold are secondarily cured (S1470). The step S1470 of secondarily curing the mixed solutions includes a step of in the second mixed solution in the mold, controlling the concentration distribution of the inorganic fillers so that the concentration of a multitude of the inorganic fillers varies depending on positions.

Specifically, the step of controlling the concentration distribution of the inorganic fillers is characterized in that, in the second mixed solution in the mold, the concentration of the inorganic fillers is controlled to increase as the position moves from the protrusion toward the base substrate. In addition, the step of curing the second mixed solution may be performed in a temperature range of 70 to 120 degrees. In some cases, the temperature may increase a precipitation rate of the inorganic fillers in the second mixed solution in a manner of increasing fluidity of the second organic solution by heating below a temperature at which the second mixed solution starts to be cured.

Thus, the step of controlling the concentration distribution of the inorganic fillers includes a step of controlling the precipitation rate of the inorganic fillers. Specifically, through a temperature change or ultraviolet (UV) irradiation to the mixed solution injected into the mold, a step of controlling the viscosity of the organic solution in the mixed solution may be included in the curing process.

However, unlike the method of fabricating the transfer substrate disclosed in FIG. 12, the fabricating method of FIG. 14 selectively forms a region, in which the inorganic fillers do not exist, at the protrusion of the organic stamp layer in advance, and the sub-step of controlling the concentration of the inorganic fillers may be omitted or partially selected, unlike FIG. 12.

Finally, when curing of the mixed solution is completed, the mold is removed (S1480).

Figure 15:
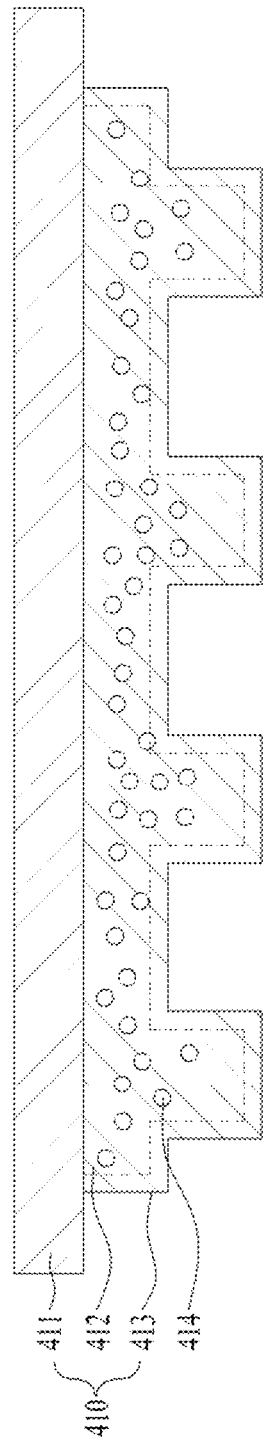
FIG. 15 is a cross-sectional diagram of the transfer substrate fabricated according to the flowchart of FIG. 14.

FIG. 15 is a cross-sectional diagram of the transfer substrate fabricated according to the flowchart of FIG. 14.

As shown in FIG. 15, the transfer substrate 410 includes a base layer 411 and a stamp layer 412/413 located on the base layer 411 and having a protrusion.

In addition, the organic stamp layer includes a first organic stamp layer 412 containing a multitude of inorganic fillers 414 and a second organic stamp layer 413 having no inorganic fillers present therein.

A concentration gradient of the inorganic fillers 414 in the first organic stamp layer 412 may gradually increase toward a direction of the base layer 411 from a direction of the protrusion of the organic stamp layer 412. Alternatively, the concentration of the inorganic fillers 414 in the first organic stamp layer 412 may be uniformly formed. However, if a concentration difference of the inorganic fillers 414 is severe at the interface between the first organic stamp layer 412 and the second organic stamp layer 413, the interface may be peeled off, and thus it is important to adjust the concentration of the inorganic fillers 414 at an appropriate level.

In addition, a height of the protrusion of the organic stamp layer may be determined based on the thickness of the semiconductor light emitting element contacting the protrusion. For example, the height of the protrusion is greater than the thickness of the semiconductor light emitting element. If the height of the protrusion is too small compared to the thickness of the semiconductor light emitting element, it is difficult for the semiconductor light emitting element to be stably transferred by adhering to the protrusion. In addition, as described above, the semiconductor light emitting element may be a horizontal semiconductor light emitting element or a vertical semiconductor light emitting element, and the thickness of the semiconductor light emitting element is proportional to a thickness at which a semiconductor layer is stacked when the semiconductor light emitting element is formed on a growth substrate.

In addition, a width of the protrusion is formed to be wider than a width of the semiconductor light emitting element contacting the protrusion. For example, since a horizontal semiconductor light emitting element has a width of about 50 µm or less, the width of the protrusion is formed to be 50 µm or more so that the semiconductor light emitting element and the protrusion can stably contact each other.

In addition, the base layer 411 may include at least one of polyethylene terephthalate (PET), polycarboxylate ether (PCE), and glass, and a main component of the organic stamp layers 412 and 413 may be polydimethylsiloxane (PDMS). Additionally, the main component of the inorganic fillers 414 may be $SiO_2$ in several tens of nm to several µm.

However, the main materials of the base layer 411, the organic stamp layers 412 and 413, and the inorganic fillers 414 are exemplary, by which the present disclosure is non-limited, and various materials may be selected at a level that can be recognized by those skilled in the art.

Figure 16:
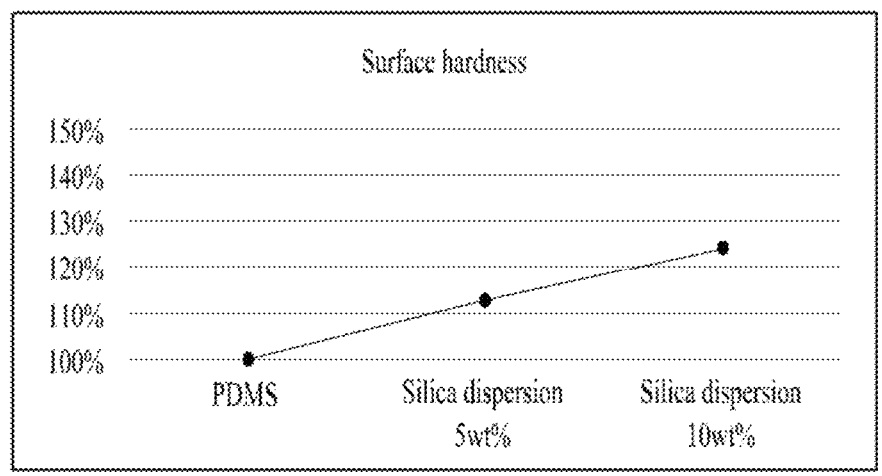
FIG. 16 is a graph showing surface hardness according to a content of inorganic filler.

FIG. 16 is a graph showing surface hardness according to a content of inorganic filler.

As shown in FIG. 16, as the content of the silica inorganic filler in the PDMS increases, the surface hardness increases. Regarding the case shown in FIG. 16, the surface hardness of PDMS prepared by dispersing $SiO_2$ (Silica) having a particle size of 1 to 2 µm is measured.

The increase in surface hardness may be determined as the increase in tensile strength or stiffness. Accordingly, the stiffness of an organic stamp layer may be improved by dispersing the inorganic fillers in the organic stamp layer for a transfer substrate. If the stiffness of the stamp layer is improved, deformation of the stamp layer is difficult to occur even in a repetitive transfer process, and thus an arrangement error of semiconductor light emitting elements, which may occur during transfer, may be minimized.

Figure 17:
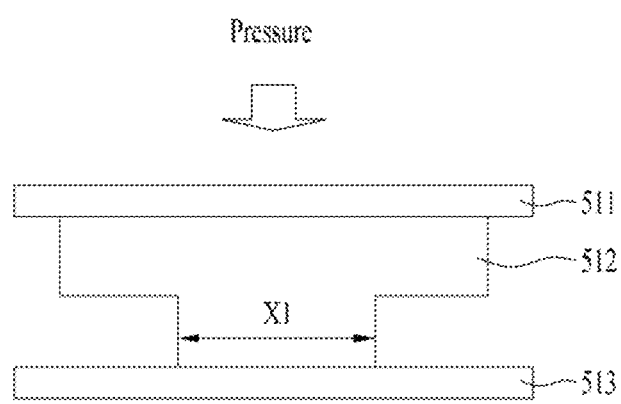
FIG. 17 shows a simulation model for observing stiffness according to a content of inorganic filler.

FIG. 17 shows a simulation model for observing stiffness according to a content of inorganic filler.

As described above, although surface hardness and stiffness are conceptually proportional to each other in general, simulation was performed to examine, more accurately, the degree to which stiffness changes according to the content of inorganic fillers.

As shown in FIG. 17, the simulation may calculate stiffness by applying a constant pressure from a substrate 511 over a stamp layer 512 having a protrusion toward a substrate 513 below and determining an extent of deformation of the protrusion.

The extent of deformation of the protrusion is determined to be a deformation extent of X1, which is a width length of the protrusion before and after a predetermined pressure.

In the simulation model of FIG. 17, a height of the protrusion is 5 µm, and a height of an organic stamp layer 512 excluding the protrusion is 10 µm. In addition, the organic stamp layer 512 uses PDMS as a main material, and inorganic fillers contained in the organic stamp layer 512 are set to be silica with a diameter of 300 nm.

Figure 18:
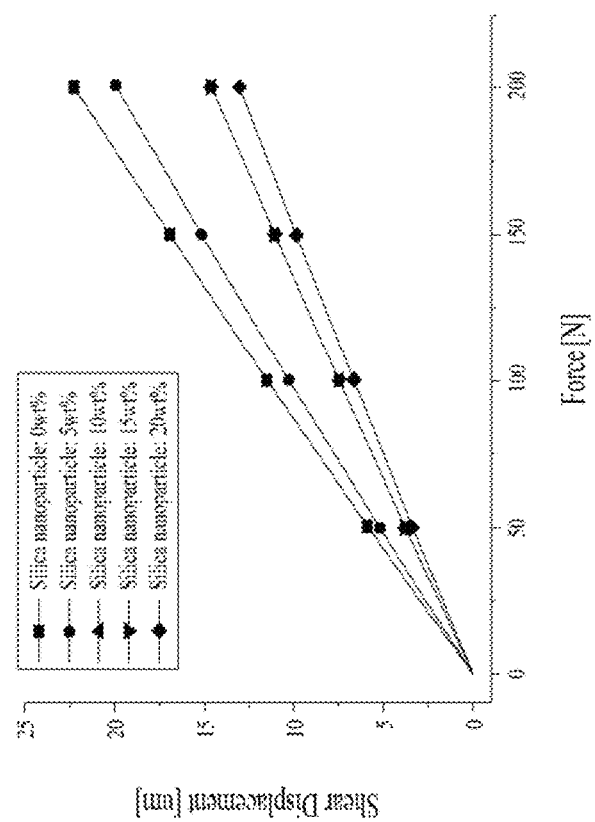
FIG. 18 show simulation results for stiffness according to a content of inorganic filler, measured according to the model of FIG. 17.

FIG. 18 show simulation results for stiffness according to a content of inorganic filler, measured according to the model of FIG. 17.

FIG. 18 (a) is a graph illustrating shear displacement in accordance with pressure in an organic stamp layer with a content of silica nanoparticles in the range of 0 to 20 wt %. The content of the silica nanoparticles was adjusted at intervals of 5 wt %. On the other hand, the graph with a silica nanoparticle content of 10 wt % and the graph with a silica nanoparticle content of 15 wt % have similar result values, and are shown as overlapping in FIG. 18 (a).

On the other hand, as shown in FIG. 18 (a), as a weight ratio of the silica contained in the organic stamp layer increases, it is observed that the shear displacement value decreases with respect to the same force. The shear displacement value may be regarded as a variation of X1 in FIG. 17.

Specifically, referring to FIG. 18 (a), when a pressure of 100N is applied to the organic stamp layer, a displacement of about 12 µm occurs in the organic stamp layer containing no silica nanoparticles, and a displacement of about 6 µm occurs in the case of an organic stamp layer containing silica nanoparticle of 20 wt %. That is, as the content of silica nanoparticles increases, the extent of deformation decreases by about 50% when the same pressure is applied.

Such a change is also evident in the stiffness constant shown in FIG. 18 (b). Increasing the stiffness coefficient means that a strain rate is small under the same pressure. As shown in FIG. 18 (b), when the organic stamp layer containing no silica nanoparticles has a stiffness coefficient of 8.96k, a stiffness coefficient of the organic stamp layer containing 20 wt % of silica nanoparticles is 15.3k. Namely, as the content of the silica nanoparticles increases, the stiffness coefficient increases, and thus it can be confirmed that the strain rate decreases under the same pressure.

Figure 19:
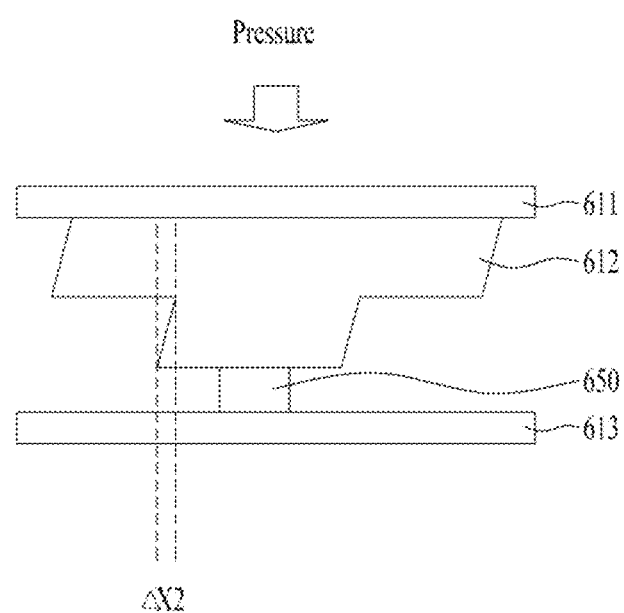
FIG. 19 shows a simulation model for observing an arrangement error according to a content of inorganic filler.

FIG. 19 shows a simulation model for observing an arrangement error according to a content of inorganic filler.

It has been described above that the cause of an arrangement error actually occurring in a transfer process of a semiconductor light emitting element is due to the deformation of an organic stamp layer in contact with the semiconductor light emitting element. However, the deformation of the organic stamp layer is greatly affected by a change in width rather than a change in height of a protrusion, with reference to the protrusion. In other words, even if a shape of the protrusion changes before and after pressure, if a central position of the protrusion does not change, an arrangement error of the semiconductor light emitting element does not occur.

However, as shown in FIG. 19, when pressure is applied to an organic stamp layer 612 from an upper substrate 611 toward a lower substrate 613, the organic stamp layer 612 may be changed by ΔX2 in a width direction of a protrusion. That is, it means that a central axis of the protrusion moves by ΔX2, and this deformation means that an arrangement error of ΔX2 may occur in a semiconductor light emitting element 650 in contact with the organic stamp layer 612 during a transfer process.

In the simulation model of FIG. 19, the height of the protrusion is 10 μm, and the height of the organic stamp layer 612 excluding the protrusion is 400 μm. In addition, the organic stamp layer 612 uses PDMS as a main material, and the inorganic fillers contained in the organic stamp layer 612 are set to be silica with a diameter of 300 nm. In addition, the semiconductor light emitting element 650 in contact with the protrusion of the organic stamp layer 612 is set to have a height of 6 μm and a width of 50 μm.

FIG. 20 shows a simulation result for an arrangement error according to a content of inorganic filler, measured according to the model of FIG. 19.

As shown in FIG. 20, as a content of silica inorganic fillers increases, an amount of change in a height direction of a protrusion decreases. In addition, as the content of the silica inorganic fillers increases, an amount of change in position in a width direction decreases with respect to a central axis of the protrusion. For example, when a displacement of 12 μm in the height direction of the protrusion and a central axis shift of 6.8 μm in the width direction occur, a displacement of 5.9 μm in the height direction of the protrusion and a displacement of 3.4 μm in the width direction occur in case of an organic stamp layer containing silica nanoparticles of 20 wt %. That is, in the simulation model, by containing silica nanoparticles of 20 Wt % in the organic stamp layer, an arrangement error of 3.4 μm may be reduced compared to the organic stamp layer not containing silica nanoparticles.

In summary, the present disclosure improves the overall stiffness of an organic stamp layer by containing inorganic fillers in the organic stamp layer. Meanwhile, the concentration of the inorganic fillers is set to be extremely low or the inorganic fillers are set not to be present at the end of a protrusion of the organic stamp layer, thereby enabling the protrusion to maintain sufficient adhesion to transfer a semiconductor light emitting element.

Accordingly, when a transfer substrate including the organic stamp layer is used, deformation of the stamp layer generated during a transfer process may be minimized, and thus an arrangement error of a semiconductor light emitting element may be reduced to improve the transfer precision.

The above description is merely illustrative of the technical spirit of the present disclosure. It will be apparent to those skilled in the art that various modifications and variations can be made in the present disclosure without departing from the spirit and scope of the disclosure.

Therefore, the embodiments disclosed in the present disclosure are merely illustrative of the technical spirit of the present disclosure. The scope of the technical spirit of the present disclosure is not limited by these embodiments.

The scope of the present disclosure should be construed by the appended claims, and all technical ideas within the scope equivalent thereto should be construed as being within the scope of the present disclosure.

What is claimed is:

1. A method of fabricating a transfer substrate comprising a stamp layer having a plurality of protrusions, the method comprising:
    preparing an etched mold;
    introducing a mixed solution comprising a curing agent, an organic solution, and inorganic fillers into the mold, wherein the plurality of protrusions are formed based on introduction of the mixed solution into etched portions of the mold;
    positioning a base substrate on top of the mold;
    turning the mold and the base substrate upside down to cause a concentration distribution of the inorganic fillers within the mold to gradually decrease within the stamp layer in a direction from the base substrate to the plurality of protrusions;
    curing the mixed solution; and
    removing the transfer substrate from the mold, wherein the concentration of the inorganic fillers in the transfer substrate gradually decreases within the stamp layer in a direction from the base substrate to the plurality of protrusions and wherein the plurality of protrusions includes a first region in which the inorganic fillers are dispersed and a second region which is substantially free of the inorganic fillers.

2. The method of claim 1, wherein the preparing the etched mold comprises:
    forming a first etched portion corresponding to the stamp layer of the transfer substrate on a flat surface of a mold substrate; and
    forming a second etched portion corresponding to the plurality of protrusions on the first etched portion.

3. The method of claim 1, wherein the curing the mixed solution is performed in a temperature range of 70° C. and 120° C.

4. The method of claim 1, wherein the turning the mold and the base substrate upside down to cause the concentration distribution of the inorganic fillers further comprises controlling a viscosity of the organic solution in the mixed solution based on a temperature or ultraviolet (UV) irradiation for the mixed solution.

5. The method of claim 1, wherein the introducing the mixed solution comprises:
    mixing the organic solution with the inorganic fillers; and
    adding the curing agent to the organic solution having the inorganic fillers dispersed therein.

6. A transfer substrate for fabricating a display device based on a semiconductor light emitting element, the transfer substrate comprising:
a base layer; and
an organic stamp layer located on the base layer and having a plurality of protrusions,
wherein the organic stamp layer includes inorganic fillers dispersed throughout the organic stamp layer,
wherein a concentration distribution of the inorganic fillers gradually decreases within the organic stamp layer in a direction from the base layer to the plurality of protrusions,
wherein the concentration distribution of the inorganic fillers increases within the organic stamp layer from ends of the plurality of protrusions toward the base layer, and
wherein the plurality of protrusions includes:
a first region in which the inorganic fillers are dispersed; and
a second region which is substantially free of the inorganic fillers.

7. The transfer substrate of claim 6,
wherein the second region is at end portions of the plurality of protrusions.

8. The transfer substrate of claim 7, wherein a first stiffness of the base layer is greater than a second stiffness of the first region, and wherein the second stiffness is greater than a third stiffness of the second region.

9. The transfer substrate of claim 6, wherein a height of each of the plurality of protrusions is determined based on a characteristic of the semiconductor light emitting element with which the respective protrusion of the plurality of protrusions is to contact for installation at the display device.

10. The transfer substrate of claim 9, wherein the height of each of the plurality of protrusions is greater than a vertical thickness of the semiconductor light emitting element.

11. The transfer substrate of claim 6, wherein a width of each of the plurality of protrusions is greater than a width of the semiconductor light emitting element with which the respective protrusion of the plurality of protrusions is to contact for installation at the display device.

12. The transfer substrate of claim 6, wherein the base layer comprises at least one of polyethylene terephthalate (PET), polycarboxylate ether (PCE), or glass.

13. The transfer substrate of claim 6, wherein a main component of the inorganic fillers is $SiO_2$ and a size of each inorganic filler is on an order of several tens of nm to several um.

14. The transfer substrate of claim 6, wherein a main component of the organic stamp layer is polydimethylsiloxane (PDMS).

15. A transfer substrate used in fabricating a display device based on a semiconductor light emitting element, the transfer substrate comprising:
a base layer;
an organic stamp layer located on the base layer and having a plurality of protrusions; and
inorganic fillers dispersed in the organic stamp layer,
wherein a concentration of the inorganic fillers gradually decreases within the organic stamp layer in a direction from the base layer to the plurality of protrusions,
wherein the plurality of protrusions includes:
a first region in which the inorganic fillers are dispersed; and
a second region which is substantially free of the inorganic fillers.

16. A method of fabricating a transfer substrate comprising a stamp layer having a plurality of protrusions, the method comprising:
preparing an etched mold;
introducing a first mixed solution to the mold comprising a first curing agent and a first organic solution;
primarily curing the first mixed solution;
introducing a second mixed solution comprising a second curing agent, a second organic solution, and inorganic fillers to the primarily cured first mixed solution, wherein the plurality of protrusions are formed based on introduction of the first mixed solution into etched portions of the mold and the second mixed solution to the primarily cured first mixed solution;
positioning a base substrate on top of the mold;
turning the mold and the base substrate upside down to cause a concentration distribution of the inorganic fillers to gradually decrease within the stamp layer in a direction from the base substrate to the plurality of protrusions;
secondarily curing the first mixed solution and the second mixed solution; and
removing the transfer substrate from the mold, wherein the concentration of the inorganic fillers in the transfer substrate gradually decreases within the stamp layer in a direction from the base substrate to the plurality of protrusions and wherein the plurality of protrusions includes a first region in which the inorganic fillers are dispersed and a second region which is substantially free of the inorganic fillers.

17. The transfer substrate of claim 15, wherein a first stiffness of the base layer is greater than a second stiffness of the first region, and wherein the second stiffness is greater than a third stiffness of the second region.

18. The transfer substrate of claim 15, wherein a height of each of the plurality of protrusions is determined based on a characteristic of the semiconductor light emitting element with which the respective protrusion of the plurality of protrusions is to contact for installation at the display device.

* * * * *